(12) United States Patent
    Kim et al.

(10) Patent No.: US 12,364,064 B2
(45) Date of Patent: Jul. 15, 2025

(54) DISPLAY DEVICE AND METHOD FOR MANUFACTURING THE SAME

(71) Applicant: SAMSUNG DISPLAY CO., LTD., Yongin-Si (KR)

(72) Inventors: Hee Na Kim, Hwaseong-si (KR); Cha Dong Kim, Seoul (KR); In Kyung Yoo, Hwaseong-si (KR); Sang Jin Lee, Suwon-si (KR); Chong Sup Chang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1028 days.

(21) Appl. No.: 17/383,315

(22) Filed: Jul. 22, 2021

(65) Prior Publication Data

US 2022/0045241 A1    Feb. 10, 2022

(30) Foreign Application Priority Data

Aug. 6, 2020   (KR) ........................ 10-2020-0098270

(51) Int. Cl.
    *H01L 25/075*     (2006.01)
    *H10H 20/01*      (2025.01)
    (Continued)

(52) U.S. Cl.
    CPC ....... *H10H 20/831* (2025.01); *H01L 25/0753* (2013.01); *H10H 20/01* (2025.01); *H10H 29/142* (2025.01); *H10H 20/032* (2025.01)

(58) Field of Classification Search
    CPC ...... H10H 29/857; H10H 29/41; H10H 29/49; H10H 29/24; H10H 29/30–49; H10H 20/857; H01L 25/0753
    See application file for complete search history.

(56) References Cited

U.S. PATENT DOCUMENTS 9,181,630 B2   11/2015  Shibata et al.
11,411,044 B2   8/2022  Cho et al.
                        (Continued)

FOREIGN PATENT DOCUMENTS

KR   10-2012-0122159 A    11/2012
KR   10-2020-0004936 A     1/2020
                        (Continued)

*Primary Examiner* — Lauren R Bell
(74) *Attorney, Agent, or Firm* — Womble Bond Dickinson (US) LLP

(57) ABSTRACT

A display device includes: a first alignment electrode and a second alignment electrode on a substrate, the first and second alignment electrodes extending in a first direction and being spaced apart from each other; an amorphous silicon layer on the first alignment electrode and the second alignment electrode, the amorphous silicon layer having an insulating portion covering the first alignment electrode and an electrode portion covering the second alignment electrode, the electrode portion of the amorphous silicon layer including an N-type dopant; a light emitting element on the amorphous silicon layer, one end of the light emitting element being on the insulating portion and another end of the light emitting element contacting the electrode portion of the amorphous silicon layer; a first insulating layer on the light emitting element and extending in the first direction; and a first electrode contacting the one end of the light emitting element.

13 Claims, 22 Drawing Sheets

(51) Int. Cl.
  *H10H 20/831*  (2025.01)
  *H10H 29/14*  (2025.01)

(56)    References Cited

U.S. PATENT DOCUMENTS

| | | | |
|---|---|---|---|
| 11,817,474 | B2 | 11/2023 | Cho et al. |
| 12,062,739 | B2 | 8/2024 | Kim et al. |
| 2021/0288217 | A1* | 9/2021 | Li .......................... H10H 20/84 |
| 2021/0296373 | A1 | 9/2021 | Yeon et al. |
| 2021/0296538 | A1* | 9/2021 | Li ........................ H10H 20/857 |
| 2022/0392948 | A1* | 12/2022 | Lee ...................... H10H 20/831 |
| 2024/0088198 | A1 | 3/2024 | Cho et al. |
| 2024/0363806 | A1 | 10/2024 | Kim et al. |

FOREIGN PATENT DOCUMENTS

| | | | | | |
|---|---|---|---|---|---|
| KR | 10-2020-0006650 | A | | 1/2020 | |
| KR | 1020210117380 | A | | 9/2021 | |
| KR | 10-2545982 | B1 | | 6/2023 | |
| WO | WO 2012-008253 | A1 | | 9/2013 | |
| WO | WO-2020013408 | A1 | * | 1/2020 | ......... H01L 25/0753 |
| WO | WO-2020017718 | A1 | * | 1/2020 | ......... H01L 25/0753 |

\* cited by examiner

DISPLAY DEVICE AND METHOD FOR MANUFACTURING THE SAME

CROSS-REFERENCE TO RELATED APPLICATION

This application claims priority to and the benefit of Korean Patent Application No. 10-2020-0098270, filed on Aug. 6, 2020, in the Korean Intellectual Property Office, the contents of which are herein incorporated by reference in their entirety.

BACKGROUND

1. Field

Aspects of embodiments of the present disclosure relate to a display device and a method for manufacturing the same.

2. Description of Related Art

Display devices have steadily become more important with the development of multimedia technology. In response thereto, various types (or kinds) of display devices, such as an organic light emitting diode (OLED) display, a liquid crystal display (LCD), and the like, have been developed.

A display device is a device for displaying an image and generally includes a display panel, such as an organic light emitting display panel or a liquid crystal display panel. Among the types of display devices, a light emitting display panel may include light emitting elements, for example, light emitting diodes (LED), and examples of the light emitting diode include an organic light emitting diode (OLED) including (or using) an organic material as a fluorescent material and an inorganic light emitting diode including (or using) an inorganic material as a fluorescent material.

SUMMARY

Aspects and features of embodiments of the present disclosure provide a display device and a method for manufacturing the same that can reduce manufacturing cost and facilitate a process by eliminating (or omitting) a mask process.

However, aspects and features of the present disclosure are not restricted to those set forth herein. The above and other aspects and features of the present disclosure will become more apparent to one of ordinary skill in the art to which the present disclosure pertains by referencing the detailed description of the present disclosure given below.

In the display device and the method for manufacturing the display device according to embodiments of the present disclosure, a second electrode (or first and second electrodes) are formed by doping a dopant into amorphous silicon so that a mask for forming each of first and second electrodes and a plurality of insulating layers may be omitted. Therefore, it is possible to reduce manufacturing cost, improve productivity, and facilitate the manufacturing process.

Again, the aspects and features of the present disclosure are not limited to those mentioned above, and various other aspects and features are included in the present disclosure.

According to an embodiment of the present disclosure, a display device includes: a first alignment electrode and a second alignment electrode on a substrate, the first and second alignment electrodes extending in a first direction and being spaced apart from each other; an amorphous silicon layer on the first alignment electrode and the second alignment electrode, the amorphous silicon layer having an insulating portion covering the first alignment electrode and an electrode portion covering the second alignment electrode, the electrode portion of the amorphous silicon layer including an N-type dopant; a light emitting element on the amorphous silicon layer, one end of the light emitting element being on the insulating portion and another end of the light emitting element contacting the electrode portion of the amorphous silicon layer; a first insulating layer on the light emitting element and extending in the first direction; and a first electrode contacting the one end of the light emitting element.

In an embodiment, the N-type dopant may include at least one selected from among phosphorus (P), arsenic (As), and antimony (Sb).

In an embodiment, a concentration of the N-type dopant may range from $10^{15}/cm^3$ to $10^{20}/cm^3$.

In an embodiment, the insulating portion of the amorphous silicon layer may overlap the first electrode and the light emitting element, and the electrode portion of the amorphous silicon layer may not overlap the first electrode and the light emitting element.

In an embodiment, the electrode portion of the amorphous silicon layer overlapping the second alignment electrode may have an electrode contact portion having a thickness larger than that of the insulating portion of the amorphous silicon layer.

In an embodiment, the electrode contact portion of the amorphous silicon layer may contact a side of the one end of the light emitting element, and a top surface of the electrode contact portion and a top surface of the light emitting element may coincide with each other in a horizontal direction.

In an embodiment, the display device may further include a second insulating layer covering the first electrode, the first insulating layer, the light emitting element, and the electrode portion of the amorphous silicon layer.

In an embodiment, the insulating portion of the amorphous silicon layer may have an opening exposing the first alignment electrode, a bottom surface of the first electrode may contact a top surface of the first alignment electrode through the opening, and a bottom surface of the electrode portion may contact a top surface of the second alignment electrode.

According to an embodiment of the present disclosure, a method for manufacturing a display device is provided. The method includes: preparing a target substrate including a first alignment electrode and a second alignment electrode; forming an amorphous silicon layer on the target substrate; aligning a light emitting element on the amorphous silicon layer; forming a first insulating layer on the light emitting element; forming a first electrode on one end of the light emitting element and the amorphous silicon layer; and forming an insulating portion of the amorphous silicon layer and an electrode portion of the amorphous silicon layer by doping an N-type dopant into a portion of the amorphous silicon layer, and another end of the light emitting element contacts the electrode portion of the amorphous silicon layer.

In an embodiment, the electrode portion of the amorphous silicon layer may be doped with the N-type dopant, and the first electrode and the light emitting element may mask the insulating portion of the amorphous silicon layer such that is not doped with the N-type dopant.

In an embodiment, the N-type dopant may include at least one selected from among phosphorus (P), arsenic (As), and antimony (Sb).

In an embodiment, the electrode portion may be doped with the N-type dopant at a concentration ranging from $10^{15}/cm^3$ to $10^{20}/cm^3$.

In an embodiment, the amorphous silicon layer may be formed using a halftone mask such that the amorphous silicon layer has an electrode contact portion, the electrode contact portion being a portion of the electrode portion having a thickness larger than that of the insulating portion.

According to an embodiment of the present disclosure, a display device includes: a first alignment electrode and a second alignment electrode on a substrate, the first and second alignment electrodes extending in a first direction and being spaced apart from each other; a first insulating layer on the first alignment electrode and the second alignment electrode; a light emitting element on the first insulating layer, one end of the light emitting element being on the first alignment electrode, another end of the light emitting element being on the second alignment electrode; and a first electrode and a second electrode on the first insulating layer to be spaced apart from each other, the first electrode overlapping the first alignment electrode to contact the one end of the light emitting element, the second electrode overlapping the second alignment electrode to contact the other end of the light emitting element. The first electrode and the second electrode include amorphous silicon, the first electrode includes a P-type dopant, and the second electrode includes an N-type dopant.

In an embodiment, the first electrode and the second electrode may extend in the first direction and may be spaced apart from each other at a region overlapping the light emitting element.

In an embodiment, the P-type dopant may include any one selected from among boron (B), aluminum (Al), gallium (Ga), and indium (In).

In an embodiment, a concentration of the N-type dopant may range from $10^{15}/cm^3$ to $10^{20}/cm^3$.

According to an embodiment of the present disclosure, a method for manufacturing a display device is provided. The method includes: preparing a target substrate including a first alignment electrode and a second alignment electrode; forming a first insulating layer on the target substrate; aligning a light emitting element on the first insulating layer; forming an amorphous silicon layer covering the light emitting element on the target substrate; forming a first mask pattern overlapping the second alignment electrode and doping the first mask pattern with a P-type dopant; removing the first mask pattern; forming a second mask pattern overlapping the first alignment electrode and doping the second mask pattern with an N-type dopant; and removing a portion of the amorphous silicon layer overlapping the light emitting element to form a first electrode contacting one end of the light emitting element and a second electrode contacting another end of the light emitting element.

In an embodiment, the first electrode may be doped with a P-type dopant, and the P-type dopant may be doped at a concentration ranging from $10^{15}/cm^3$ to $10^{20}/cm^3$.

In an embodiment, the second electrode may be doped with an N-type dopant, and the N-type dopant may be doped at a concentration ranging from $10^{15}/cm^3$ to $10^{20}/cm^3$.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
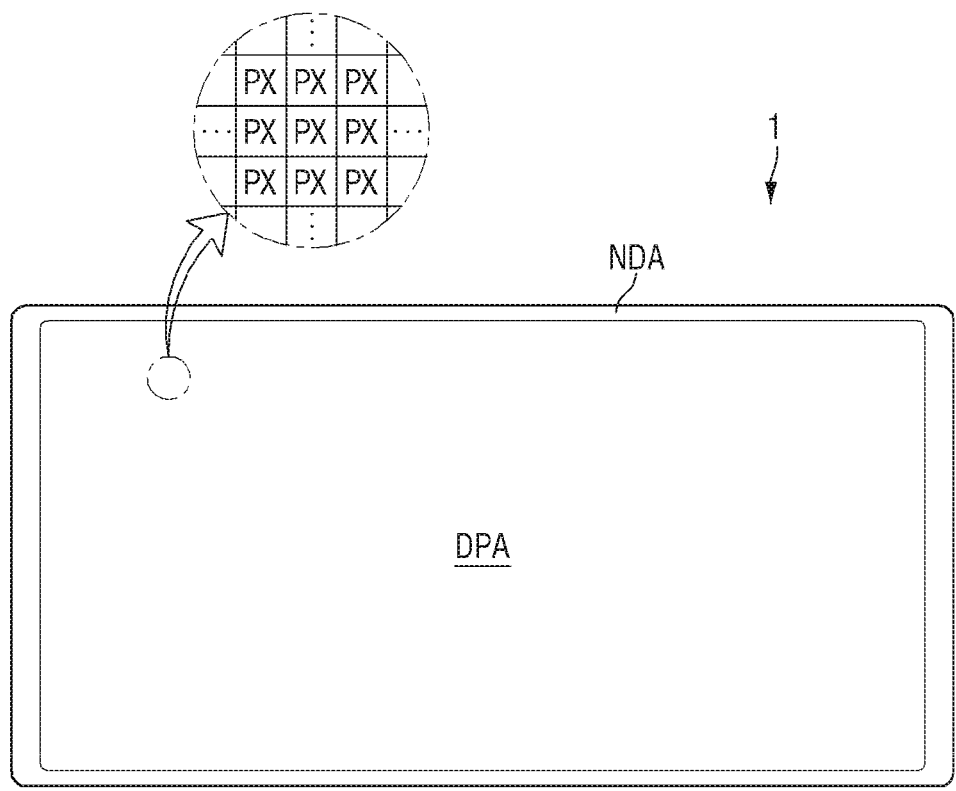
FIG. 1 is a schematic plan view of a display device according to an embodiment.
Figure 1:
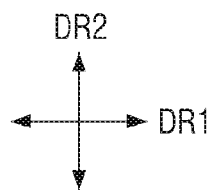

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate or intervening layers may also be present. In the figures, dimensions of the various elements, layers, etc. may be exaggerated for clarity of illustration. The same reference numbers indicate the same components throughout the specification and figures.

The use of "may" when describing embodiments of the present disclosure relates to "one or more embodiments of the present invention." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could be termed the first element.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described in detail with reference to the accompanying drawings.

FIG. 1 is a schematic plan view of a display device according to an embodiment.

Referring to FIG. 1, a display device 10 displays (e.g., is configured to display) a moving image or a still image. The display device 10 may refer to any electronic device including a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which include a display screen.

The display device 10 includes a display panel which has a display screen. Examples of the display panel may include an inorganic light emitting diode display panel, an organic light emitting display panel, a quantum dot light emitting display panel, a plasma display panel, and a field emission display panel. In the following description, the display device 10 is described as including an inorganic light emitting diode display panel, but the present disclosure is not limited thereto. Other display panels may be applied within the scope of the same or substantially similar disclosure.

The shape of the display device 10 may be variously modified. For example, the display device 10 may have a rectangular shape elongated in a horizontal direction, a rectangular shape elongated in a vertical direction, a square shape, a quadrilateral shape with rounded corners (e.g., vertices), another polygonal shape, and a circular shape. The shape of a display area DPA of the display device 10 may be similar to the overall shape of the display device 10. In FIG. 1, for example, the display device 10 and the display area DPA both have a rectangular shape elongated in the horizontal direction (e.g., the first direction DR1).

The display device 10 may include the display area DPA and a non-display area NDA. The display area DPA is an area at where an image can be displayed, and the non-display area NDA is an area where an image is not displayed. The display area DPA may also be referred to as an active region, and the non-display area NDA may also be referred to as a non-active region. The display area DPA may occupy substantially the center of the display device 10.

A plurality of pixels PX may be arranged in the display area DPA. The plurality of pixels PX may be arranged in a matrix. Each pixel PX may have a rectangular or square shape in a plan view. However, the present disclosure is not limited thereto, and each pixel PX may have a rhombic shape in which each side is inclined with respect to one direction. The pixels PX may be alternately disposed in a stripe type or a PENTILE (a trademark owned by Samsung Display Co., Ltd.), such as an RGBG matrix. type. In addition, each of the pixels PX may include one or more light emitting elements 30 that emit light of a specific wavelength band to display a corresponding (or specific) color.

The non-display area NDA may be disposed around (e.g., may extend around a periphery of) the display area DPA. The non-display area NDA may completely or partially surround (or extend around a periphery of) the display area DPA. The display area DPA may have a rectangular shape, and the non-display area NDA may be disposed adjacent to four sides of the display area DPA. The non-display area NDA may form a bezel of the display device 10. Wirings or circuit drivers included in the display device 10 may be disposed in the non-display area NDA, or external devices may be mounted thereon.

Figure 2:
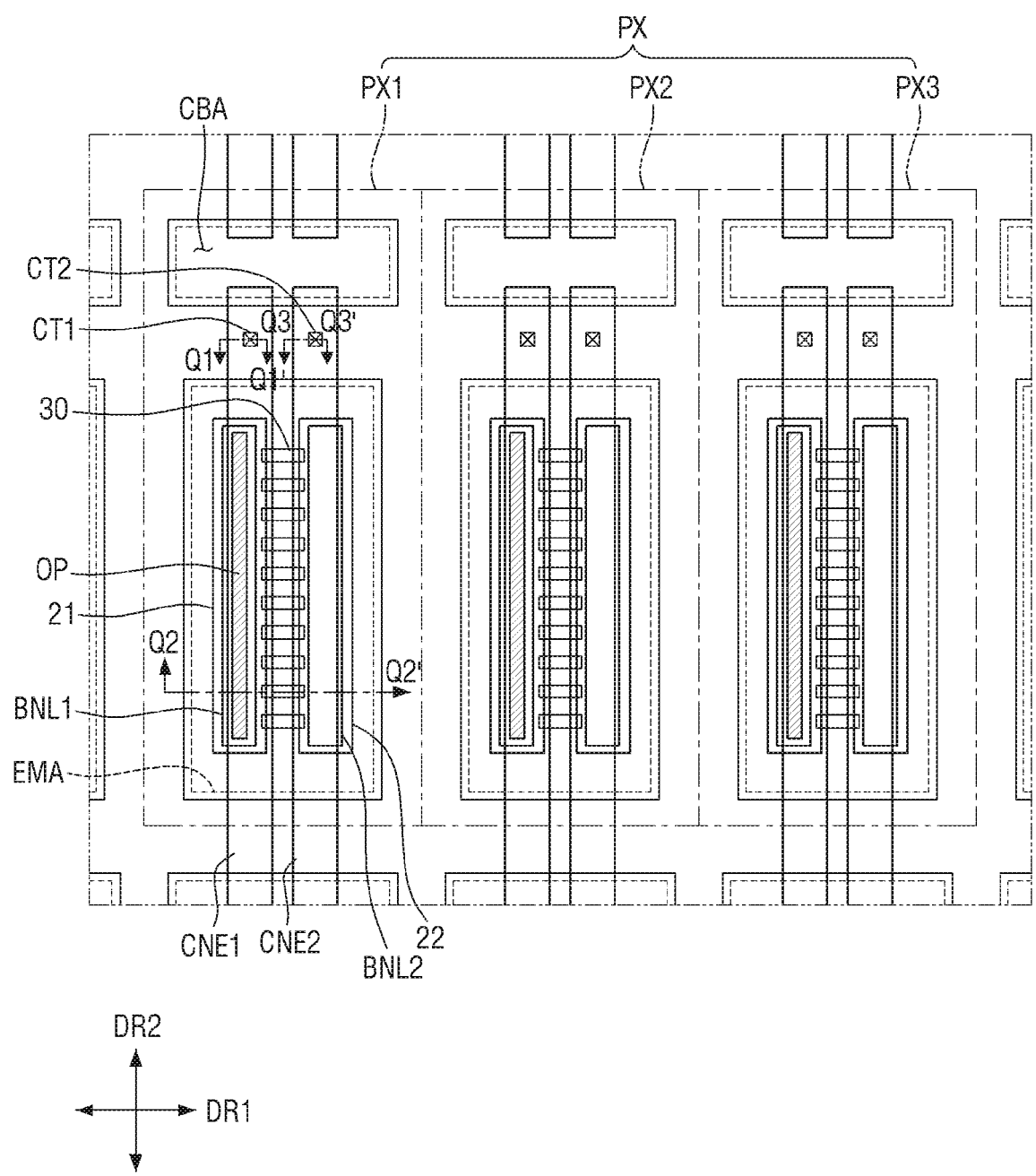
FIG. 2 is a plan view illustrating one pixel of a display device according to an embodiment.

FIG. 2 is a plan view illustrating one pixel of a display device according to an embodiment.

Referring to FIG. 2, each of the plurality of pixels PX may include a plurality of sub-pixels PXn (n being an integer of, for example, 1 to 3). For example, one pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the present disclosure is not limited thereto, and the sub-pixels PXn may emit light of the same color. In addition, although FIG. 2 illustrates a pixel PX including three sub-pixels PXn, the present disclosure is not limited thereto, and the pixel PX may include a greater number of sub-pixels PXn.

Each sub-pixel PXn of the display device 10 may have an emission area EMA and a non-emission area. The emission area EMA may be an area at where the light emitting element 30 is disposed to emit light of a specific wavelength band. The non-emission area may be an area at where the light emitting element 30 is not disposed and light emitted from the light emitting element 30 does not reach, so that no light is emitted from the non-emission area. The emission area may include an area at where the light emitting element 30 is disposed and an area adjacent to the light emitting element 30 at where light emitted from the light emitting element 30 is emitted.

Without being limited thereto, the emission area may also include an area at where the light emitted from the light emitting element 30 is reflected or refracted by another member and is emitted (e.g., is emitted from the display device 10). A plurality of the light emitting elements 30 may be disposed in each sub-pixel PXn, and the emission area may include an area at where the light emitting elements 30 are disposed and an area adjacent thereto.

The sub-pixels PXn may each include a cutout area CBA disposed in the non-emission area. The cutout area CBA may be disposed on one side of the emission area EMA in a second direction DR2. The cutout area CBA may be disposed between the emission areas EMA of the sub-pixels PXn that are adjacent to each other in the second direction DR2. The plurality of emission areas EMA and cutout areas CBA may be arranged in the display area DPA of the display device 10. For example, the plurality of emission areas EMA and the plurality of cutout areas CBA may each be repeatedly disposed in a first direction DR1 and alternately disposed in the second direction DR2. In addition, the separation distance between the cutout areas CBA in the first direction DR1 may be smaller than the separation distance between the emission areas EMA in the first direction DR1 (e.g., the cutout areas CBA may be larger than the emission areas EMA in the first direction DR1). A second bank BNL2 may be disposed between the cutout areas CBA and between the emission areas EMA, and the distance therebetween may vary with the width of the second bank BNL2. Although light is not emitted from the cutout area CBA because no light emitting element 30 is disposed therein, a portion of alignment electrodes 21 and 22 provided in each sub-pixel PXn may be disposed in the cutout area CBA. The alignment electrodes 21 and 22 provided in each sub-pixel PXn may be disposed separately from each other in the cutout area CBA.

Figure 3:
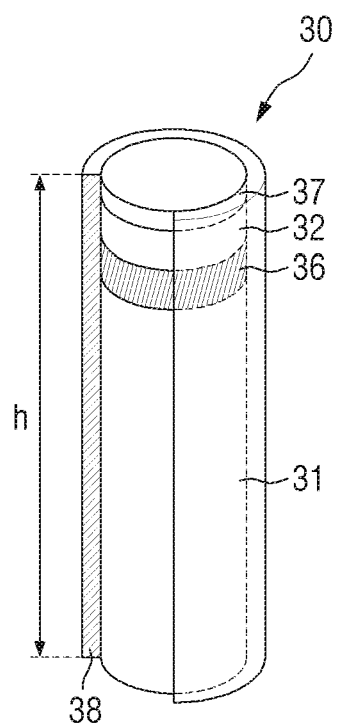
FIG. 3 is an enlarged perspective view of a light emitting element shown in FIG. 2.

FIG. 3 is a perspective view schematically showing a light emitting element according to an embodiment.

Referring to FIG. 3, the light emitting element 30 may be a light emitting diode. For example, the light emitting element 30 may be an inorganic light emitting diode that has a micrometer or nanometer size and includes (or is formed of) an inorganic material. The inorganic light emitting diode may be aligned between two electrodes (e.g., the alignment electrodes 21 and 22 in, for example, FIG. 4) having different (e.g., opposite) polarities from each other when an electric field is formed in a specific direction between the two electrodes that are opposite to each other. The light emitting element 30 may be aligned between the electrodes by the electric field formed between the two electrodes.

The light emitting element 30 according to an embodiment may have a shape extending in one direction (e.g., extending primarily in or extended in one direction). The light emitting element 30 may have a cylinder shape, a rod shape, a wire shape, a tube shape, or the like. However, the shape of the light emitting element 30 is not limited thereto, and the light emitting element 30 may have a polygonal prism shape, such as a regular cube, a rectangular parallelepiped, and a hexagonal prism or may have various other shapes, such as a shape extending in one direction and having an outer surface that is partially inclined. A plurality of semiconductors included in the light emitting element 30, to be described in more detail below, may have a structure in which they are sequentially arranged or stacked along the one direction.

The light emitting element 30 may include a semiconductor layer doped with any conductivity type (e.g., p-type or n-type) impurities. The semiconductor layer may emit light of a specific wavelength band by receiving (or in response to) an electrical signal applied from an external power source.

As illustrated in FIG. 3, the light emitting element 30 may include a first semiconductor layer 31, a second semiconductor layer 32, a light emitting layer (e.g., an active layer) 36, an electrode layer 37, and an insulating layer 38.

The first semiconductor layer 31 may be an n-type semiconductor. When the light emitting element 30 emits light of a blue wavelength band, the first semiconductor layer 31 may include a semiconductor material having a composition ratio of $Al_xGa_yIn_{(1-x-y)}N$ ($0 \leq x \leq 1$, $0 \leq y \leq 1$, $0 \leq x+y \leq 1$). For example, the semiconductor material may be any one or more of n-type doped AlGaInN, GaN, AlGaN, InGaN, AlN, and InN. The first semiconductor layer 31 may be doped with an n-type dopant, and the n-type dopant may be Si, Ge, Sn, or the like. For example, the first semiconductor layer 31 may be n-GaN doped with n-type Si. The length of the first semiconductor layer 31 may be in a range of about 1.5 μm to about 5 μm but is not limited thereto.

The second semiconductor layer 32 is disposed on the light emitting layer 36, which is described below in more detail. The second semiconductor layer 32 may be a p-type semiconductor. When the light emitting element 30 emits light of a blue or green wavelength band, the second semiconductor layer 32 may include a semiconductor material having a composition ratio of $Al_xGa_yIn_{(1-x-y)}N$ ($0 \leq x \leq 1$, $0 \leq y \leq 1$, $0 \leq x+y \leq 1$). For example, the semiconductor material may be any one or more of p-type doped AlGaInN, GaN, AlGaN, InGaN, AlN, and InN. The second semiconductor layer 32 may be doped with a p-type dopant, and the p-type dopant may be Mg, Zn, Ca, Se, Ba, or the like. For example, the second semiconductor layer 32 may be p-GaN doped with p-type Mg. The length of the second semiconductor layer 32 may be in a range of about 0.05 μm to about 0.10 μm but is not limited thereto.

Although the first semiconductor layer 31 and the second semiconductor layer 32 are configured as one layer in the embodiment illustrated in FIG. 3, the present disclosure is not limited thereto. Depending on the material of the light emitting layer 36, the first semiconductor layer 31 and the second semiconductor layer 32 may include a greater number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be alternately stacked. The light emitting layer 36 may emit light by coupling of electron-hole pairs according to (or in response to) an electrical signal applied through the first semiconductor layer 31 and the second semiconductor layer 32. When the light emitting layer 36 emits light of a blue wavelength band, a material such as AlGaN or AlGaInN may be included. For example, when the light emitting layer 36 has a structure in which quantum layers and well layers are alternately stacked in a multiple quantum well structure, the quantum layer may include a material such as AlGaN or AlGaInN and the well layer may include a material such as GaN or AlInN. For example, as described above, the light emitting layer 36 may include AlGaInN as a quantum layer and AlInN as a well layer, and the light emitting layer 36 may emit blue light having a central wavelength band in a range of about 450 nm to about 495 nm.

However, the present disclosure is not limited thereto, and the light emitting layer 36 may have a structure in which semiconductor materials having large band gap energy and semiconductor materials having small band gap energy are alternately stacked and may include other Group III to V semiconductor materials according to the wavelength band of the emitted light. The light emitted by the light emitting layer 36 is not limited to light of a blue wavelength band, and the active layer 36 may emit light of a red or green wavelength band in other embodiments. The length of the light emitting layer 36 may be in a range of about 0.05 μm to about 0.10 μm but is not limited thereto.

Light emitted from the light emitting layer 36 may be emitted to both side surfaces as well as the outer surface of the light emitting element 30 in a longitudinal direction. For example, the directionality of light emitted from the light emitting layer 36 is not limited to one direction.

Figure 4:
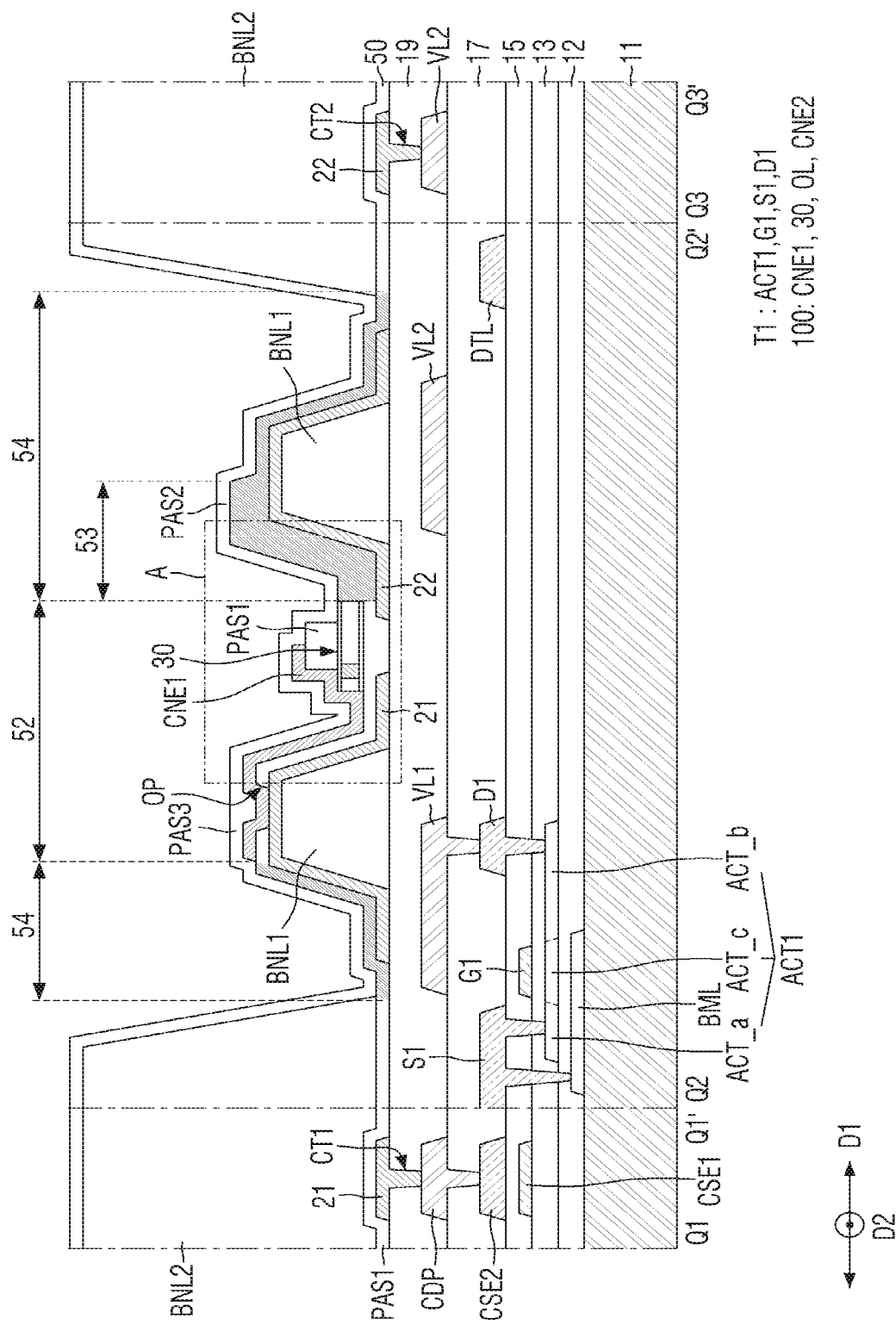
FIG. 4 is a cross-sectional view taken along the lines Q1-Q1', Q2-Q2', and Q3-Q3' of FIG. 2.
Figure 5:
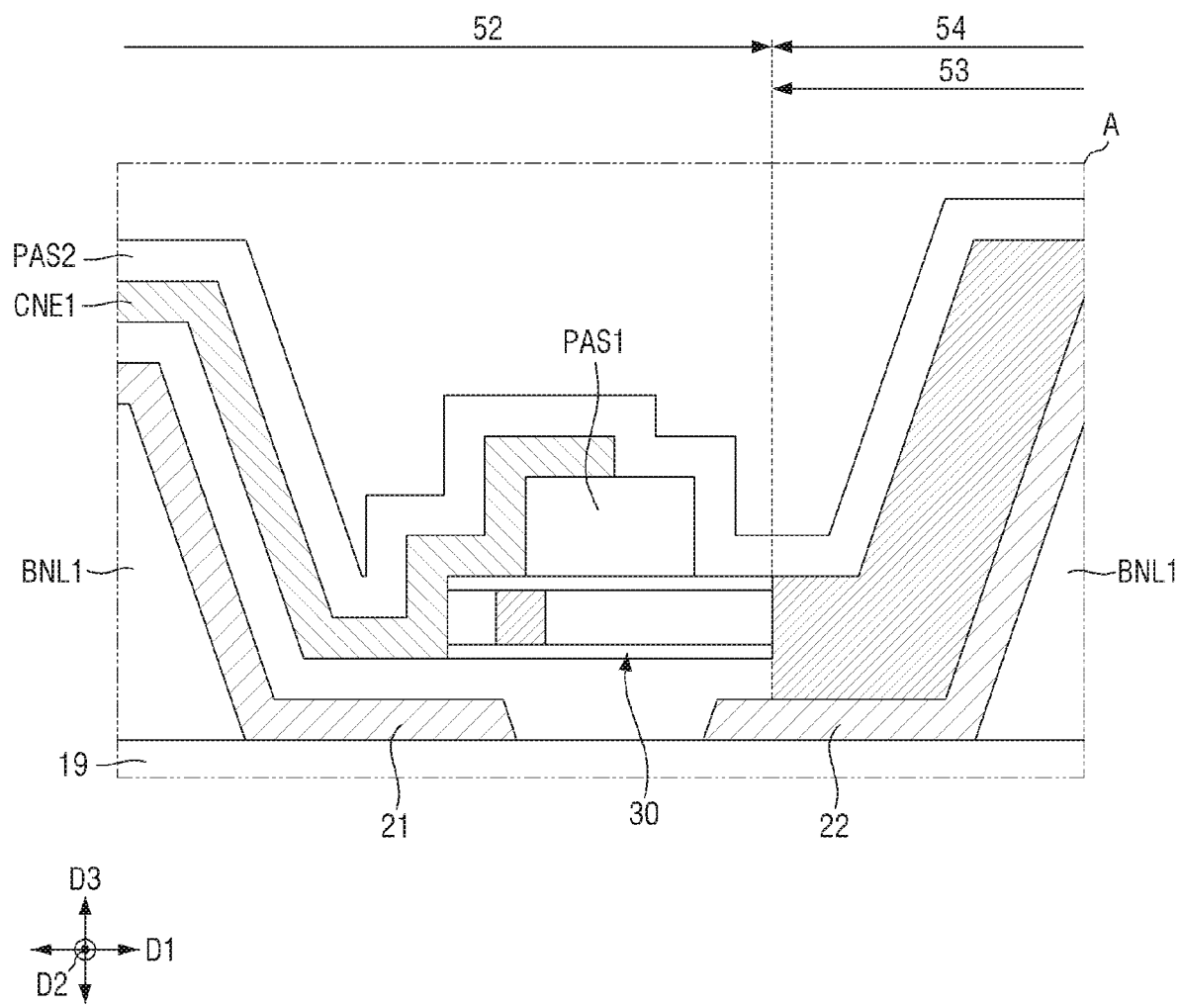
FIG. 5 is an enlarged cross-sectional view of the area A of FIG. 4.

FIG. 4 is a cross-sectional view taken along the lines Q1-Q1', Q2-Q2', and Q3-Q3' of FIG. 2, and FIG. 5 is an enlarged cross-sectional view of the area A of FIG. 4. Here, FIGS. 4 and 5 show a cross section passing through, among other layers and elements, both ends of the light emitting element 30 disposed in the first sub-pixel PX1 of FIG. 2.

Referring to FIG. 4 together with FIG. 2, the display device 10 may include a substrate (e.g., a first substrate) 11, and a semiconductor layer, a plurality of conductive layers, and a plurality of insulating layers disposed on the first substrate 11. The semiconductor layer, the conductive layers, and the insulating layers may each constitute a circuit layer and a light emitting element layer of the display device 10.

The first substrate 11 may be an insulating substrate. The first substrate 11 may include (or may be formed of) an insulating material, such as glass, quartz, or polymer resin. Further, the first substrate 11 may be a rigid substrate or a flexible substrate which can be bent, folded or rolled.

A light blocking layer BML may be disposed on the first substrate 11. The light blocking layer BML may be disposed to overlap an active layer ACT of a first transistor T1 of the display device 10. The light blocking layer BML includes a material that blocks light, thereby preventing or substantially preventing light from entering the active layer ACT of the first transistor T1. For example, the light blocking layer BML may include (or may be formed of) an opaque metal material that blocks the transmission of light. However, the present disclosure is not limited thereto, and in some embodiments, the light blocking layer BML may be omitted.

A buffer layer 12 may be entirely disposed on the first substrate 11 including the light blocking layer BML. The buffer layer 12 may be formed on the first substrate 11 to protect the first transistors T1 of the pixel PX from moisture permeating through the first substrate 11, which may be susceptible to moisture permeation, and may perform a surface planarization function. The buffer layer 12 may include (or may be formed of) a plurality of inorganic layers that are alternately stacked. For example, the buffer layer 12 may have a multilayer structure in which inorganic layers including at least one of silicon oxide ($SiO_x$), silicon nitride ($SiN_x$) and silicon oxynitride ($SiO_xN_y$) are alternately stacked.

An active layer ACT may be disposed on the buffer layer 12. The active layer ACT may be the active layer ACT of the first transistor T1. The active layer ACT may be disposed to partially overlap a gate electrode G1 and the like of a first gate conductive layer, which will be described in more detail below.

Although only the first transistors T1 from among the transistors included in the sub-pixel PXn of the display device 10 are shown in the drawing, the present disclosure is not limited thereto. The display device 10 may include more transistors. For example, the display device 10 may include two or three transistors for each sub-pixel PXn by including one or more transistors in addition to the first transistor T1.

The active layer ACT may include polycrystalline silicon, monocrystalline silicon, an oxide semiconductor, or the like. When the active layer ACT includes the oxide semiconductor, each active layer ACT may include a plurality of conductive regions ACT_a and ACT_b and a channel region ACT_c between them. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like.

In another embodiment, the active layer ACT may include polycrystalline silicon. The polycrystalline silicon may be formed by crystallizing amorphous silicon. In such an embodiment, the conductive regions of the active layer ACT may be regions doped with impurities.

A first gate insulating layer 13 may be disposed on the active layer ACT and the buffer layer 12. The first gate insulating layer 13 may include (e.g., may extend over) the active layer ACT and be disposed on the buffer layer 12. The first gate insulating layer 13 may function as a gate insulating layer of each transistor. The first gate insulating layer 13 may include (or may be formed of) an inorganic layer including an inorganic material, such as silicon oxide ($SiO_x$), silicon nitride ($SiN_x$) or silicon oxynitride ($SiO_xN_y$), or a stacked structure thereof.

The first gate conductive layer may be disposed on the first gate insulating layer 13. The first gate conductive layer may include the gate electrode G1 of the first transistor T1 and a first capacitive electrode CSE1 of a storage capacitor. The gate electrode G1 may be disposed to overlap a channel region ACT_c of the active layer ACT in the thickness direction. The first capacitive electrode CSE1 may be disposed to overlap a second capacitive electrode CSE2, to be described in more detail later, in the thickness direction. In an embodiment, the first capacitive electrode CSE1 may be connected to and integrated with the gate electrode G1. The first capacitive electrode CSE1 is disposed to overlap the second capacitive electrode CSE2 in the thickness direction, and a storage capacitor may be formed therebetween.

The first gate conductive layer may have a single layer or multilayer structure including (or formed of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

A first interlayer insulating layer 15 may be disposed on the first gate conductive layer. The first interlayer insulating layer 15 may function as an insulating layer between the first gate conductive layer and other layers disposed thereon. Further, the first interlayer insulating layer 15 may be arranged to cover the first gate conductive layer to protect the first gate conductive layer. The first interlayer insulating layer 15 may include (or may be formed of) an inorganic layer including an inorganic material, such as silicon oxide ($SiO_x$), silicon nitride ($SiN_x$) or silicon oxynitride ($SiO_xN_y$), or a stacked structure thereof.

A first data conductive layer may be disposed on the first interlayer insulating layer 15. The first data conductive layer may include a first source electrode S1 and a first drain electrode D1 of the first transistor T1, a data line DTL, and the second capacitive electrode CSE2.

The first source electrode S1 and the first drain electrode D1 of the first transistor T1 may respectively contact doped regions ACT_a and ACT_b of the active layer ACT via contact openings (e.g., contact holes) penetrating the first interlayer insulating layer 15 and the first gate insulating layer 13. Further, the first source electrode S1 of the first transistor T1 may be electrically connected to the light blocking layer BML through another contact opening (e.g., another contact hole).

The data line DTL may apply a data signal to another transistor included in the display device 10. The data line DTL may be connected to a source/drain electrode of another transistor to transfer a signal applied from the data line DTL.

The second capacitive electrode CSE2 may be disposed to overlap the first capacitive electrode CSE1 in the thickness direction. In an embodiment, the second capacitive electrode CSE2 may be connected integrally with the first source electrode S1.

The first data conductive layer may have a single layer or multilayer structure including (or formed of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

A second interlayer insulating layer 17 may be disposed on the first data conductive layer. The second interlayer insulating layer 17 may function as an insulating layer between the first data conductive layer and other layers disposed thereon. In addition, the second interlayer insulating layer 17 may cover the first data conductive layer and function to protect the first data conductive layer. The second interlayer insulating layer 17 may include (or may be formed of) an inorganic layer including an inorganic material, such as silicon oxide ($SiO_x$), silicon nitride ($SiN_x$) or silicon oxynitride ($SiO_xN_y$), or a stacked structure thereof.

The second data conductive layer may be disposed on the second interlayer insulating layer 17. The second data conductive layer may include a first voltage line VL1, a second voltage line VL2, and a first conductive pattern CDP. The first voltage line VL1 may be applied with a high potential voltage (e.g., a first source voltage) supplied to the first transistor T1, and the second voltage line VL2 may be applied with a low potential voltage (e.g., a second source voltage) supplied to a second alignment electrode 22. Also, during the manufacturing process of the display device 10, the second voltage line VL2 may be applied with an alignment signal to align the light emitting element 30.

The first conductive pattern CDP may be connected to a second capacitive electrode CSE2 through a contact opening (e.g., a contact hole) formed in the second interlayer insulating layer 17. The second capacitive electrode CSE2 may be integrated with the first source electrode S1 of the first transistor T1, and the first conductive pattern CDP may be electrically connected to the first source electrode S1. The first conductive pattern CDP may also contact a first alignment electrode 21, to be described in more detail below, and the first transistor T1 may transfer the first source voltage applied from the first voltage line VL1 to the first alignment electrode 21 through the first conductive pattern CDP. Although, in the illustrated embodiment, the second data conductive layer includes one second voltage line VL2 and one first voltage line VL1, the present disclosure is not limited thereto. The second data conductive layer may include a larger number of (e.g., a plurality of) first voltage lines VL1 and second voltage lines VL2.

The second data conductive layer may have a single layer or multilayer structure including (or formed of) any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

A first planarization layer 19 may be disposed on the second data conductive layer. The first planarization layer 19 may include an organic insulating material, for example, an organic material, such as polyimide (PI), to perform a surface planarization function.

A plurality of first banks BNL1, a plurality of alignment electrodes 21 and 22, the light emitting element 30, and the second bank BNL2 may be disposed on the first planarization layer 19. In addition, a first insulating layer PAS1 may be disposed on the first planarization layer 19.

The plurality of first banks BNL1 may be directly disposed on the first planarization layer 19. The plurality of first banks BNL1, which have a shape extending in (e.g., primarily extending in) the second direction DR2 within each sub-pixel PXn, but without extending to other sub-pixels PXn adjacent thereto in the second direction DR2, may be disposed in the emission area EMA. In addition, the plurality of first banks BNL1 may be disposed to be spaced apart from each other in the first direction DR1, and the light emitting element 30 may be disposed therebetween. The plurality of first banks BNL1 may be disposed for each sub-pixel PXn to form a linear pattern in the display area DPA of the display device 10. In FIGS. 4 and 5, two first banks BNL1 are illustrated, but the present disclosure is not limited thereto. A greater number of first banks BNL1 may be disposed depending on the number of the alignment electrodes 21 and 22.

The first bank BNL1 may have a structure in which at least a portion thereof protrudes from the top surface of the first planarization layer 19. The protruding portion of the first bank BNL1 may have an inclined side surface, and the light emitted from the light emitting element 30 may be reflected by the alignment electrodes 21 and 22 disposed on the first bank BNL1 to be emitted in an upward direction of the first planarization layer 19. The first bank BNL1 may provide a region in which the light emitting element 30 is disposed (e.g., a region between two adjacent first banks BNL1 in a sub-pixel PXn) and may also function as a reflective partition wall that reflects light emitted from the light emitting element 30 upward. The side surface of the first bank BNL1 may be inclined in a linear shape but is not limited thereto, and in other embodiments, the outer surface of the first bank BNL1 may have a curved semi-circle or semi-ellipse shape. The first banks BNL1 may include an organic insulating material, such as polyimide (PI), but are not limited thereto.

The plurality of alignment electrodes 21 and 22 may be disposed on the first bank BNL1 and the first planarization layer 19. The plurality of alignment electrodes 21 and 22 may include a first alignment electrode 21 and a second alignment electrode 22. The first alignment electrode 21 and the second alignment electrode 22 may extend in the second direction DR2 and may be disposed to be spaced apart from each other in the first direction DR1.

The first alignment electrode 21 and the second alignment electrode 22 may extend in the second direction DR2 within the sub-pixel PXn and may be separated from other alignment electrodes 21 and 22 by the cutout area CBA. For example, the cutout area CBA may be disposed between the emission areas EMA of the sub-pixels PXn adjacent to each other in the second direction DR2, and the first alignment electrode 21 and the second alignment electrode 22 may be separated from other first and second alignment electrodes 21 and 22 disposed in the sub-pixel PXn adjacent in the second direction DR2 in the cutout area CBA. However, the present disclosure is not limited thereto, and some of the alignment electrodes 21 and 22 may be arranged to extend beyond the adjacent sub-pixel PXn in the second direction DR2 without being separated for each sub-pixel PXn, or only one of the first alignment electrode 21 and the second alignment electrode 22 may be separated.

The first alignment electrode 21 may be electrically connected to the first transistor T1 through a first contact opening (e.g., a first contact) hole CT1, and the second alignment electrode 22 may be electrically connected to the second voltage line VL2 through a second contact opening (e.g., a second contact hole) CT2. For example, the first alignment electrode 21 may contact the first conductive pattern CDP through the first contact opening CT1 that penetrates the first planarization layer 19 under a portion of the second bank BNL2 extending in the first direction DR1. The second alignment electrode 22 may contact the second voltage line VL2 through the second contact opening CT2 that penetrates the first planarization layer 19 under a portion of the second bank BNL2 extending in the first direction DR1. However, the present disclosure is not limited thereto. In another embodiment, the first contact opening CT1 and the second contact opening CT2 may be disposed in the emission area EMA surrounded by the second bank BNL2 so as not to overlap the second bank BNL2.

In FIGS. 4 and 5, one first alignment electrode 21 and one second alignment electrode 22 are disposed for each sub-pixel PXn, but the present disclosure is not limited thereto and a greater number of the first alignment electrodes 21 and a greater number of the second alignment electrodes 22 may be disposed in the sub-pixel PXn. In addition, the first alignment electrode 21 and the second alignment electrode 22 disposed in each sub-pixel PXn may not necessarily have a shape extending in one direction, and the first alignment electrode 21 and the second alignment electrode 22 may be arranged in various structures (e.g., may have various suitable shapes). For example, the first alignment electrode 21 and the second alignment electrode 22 may have a partially curved or bent shape, and one electrode may be disposed to surround (or extend around a periphery of) the other electrode.

The first alignment electrode 21 and the second alignment electrode 22 may be directly disposed on the first banks BNL1, respectively. Each of the first alignment electrode 21 and the second alignment electrode 22 may be formed to have a larger width than that of the first bank BNL1. For example, the first alignment electrode 21 and the second alignment electrode 22 may be disposed to cover the outer surface of the first bank BNL1. The first alignment electrode 21 and the second alignment electrode 22 may be disposed on the side surfaces of the first bank BNL1, respectively, and a distance between the first alignment electrode 21 and the second alignment electrode 22 may be smaller than a distance between the first banks BNL1. Further, at least a portion of the first alignment electrode 21 and at least a portion of the second alignment electrode 22 may be directly disposed on the first planarization layer 19 so that they may be disposed on the same plane. However, the present disclosure is not limited thereto. In some embodiments, each of the alignment electrodes 21 and 22 may have a width smaller than that of the first bank BNL1. However, each of the alignment electrodes 21 and 22 may be disposed to cover at least one side surface of the first bank BNL1 to reflect light emitted from the light emitting element 30.

Each of the alignment electrodes 21 and 22 may include a conductive material having high reflectivity. For example, each of the alignment electrodes 21 and 22 may include a metal, such as silver (Ag), copper (Cu), or aluminum (Al) as a material having high reflectivity, or may be an alloy including aluminum (Al), nickel (Ni), lanthanum (La), and the like. Each of the alignment electrodes 21 and 22 may reflect, in the upward direction of each sub-pixel PXn, light emitted from the light emitting element 30 that travels to the side surface of the first bank BNL1.

However, the present disclosure is not limited thereto, and each of the alignment electrodes 21 and 22 may further include a transparent conductive material. For example, each of the alignment electrodes 21 and 22 may include a material such as indium tin oxide (ITO), indium zinc oxide (IZO), and indium tin zinc oxide (ITZO). In some embodiments, each of the alignment electrodes 21 and 22 may have a structure in which at least one transparent conductive material and at least one metal layer having high reflectivity are stacked, or may be formed as one layer including them. For example, each of the alignment electrodes 21 and 22 may have a stacked structure, such as ITO/silver (Ag)/ITO, ITO/Ag/IZO, or ITO/Ag/ITZO/IZO.

From among the plurality of alignment electrodes 21 and 22, the first alignment electrode 21 may be electrically connected to the light emitting elements 30 and may be applied with a voltage (e.g., a predetermined voltage) to allow the light emitting elements 30 to emit light. The first alignment electrode 21 may be electrically connected to the light emitting element 30 through a first electrode CNE1 and transmit an electrical signal applied to the first alignment electrode 21 through the first electrode CNE1 to the light emitting element 30. The first alignment electrode 21 may be electrically connected to an anode of the light emitting element 30 or may be electrically connected to a cathode thereof.

Further, each of the alignment electrodes 21 and 22 may be used to form an electric field in the sub-pixel PXn to align the light emitting element 30. The light emitting element 30 may be arranged (or disposed) between the first alignment electrode 21 and the second alignment electrode 22 by the electric field formed between the first alignment electrode 21 and the second alignment electrode 22. The light emitting elements 30 may be injected onto the alignment electrodes 21 and 22 through an inkjet printing process. When (or after) inks including the light emitting elements 30 are injected onto the alignment electrodes 21 and 22, an alignment signal is applied to the alignment electrodes 21 and 22 to generate an electric field. The light emitting elements 30 dispersed in the inks may be aligned on the alignment electrodes 21 and 22 by receiving the dielectrophoretic force by the electric field generated on the alignment electrodes 21 and 22.

An amorphous silicon layer 50 may be disposed on the substrate 11 on which the first and second alignment electrodes 21 and 22 are disposed. The amorphous silicon layer 50 may be disposed to cover the first alignment electrode 21 and the second alignment electrode 22. The amorphous silicon layer 50 may protect the first alignment electrode 21 and the second alignment electrode 22 and insulate them from each other. In addition, the amorphous silicon layer 50 may prevent the light emitting element 30 from being damaged by direct contact with other members.

In an embodiment, the amorphous silicon layer 50 may have an opening OP partially exposing the first alignment electrode 21. The opening OP may expose a portion of the first alignment electrode 21 disposed on the top surface of the first bank BNL1. The first electrode CNE1 may contact the first alignment electrode 21 exposed through the opening OP.

In an embodiment, the amorphous silicon layer 50 may include an insulating portion 52 and an electrode portion 54. The insulating portion 52 may be a region overlapping the first electrode CNE1 and the light emitting element 30. The insulating portion 52 may include amorphous silicon and may act as an insulating layer. Further, the insulating portion 52 may be a region overlapping the second bank BNL2. The insulating portion 52 may be a region in which an N-type dopant is not included in the amorphous silicon layer 50. When the N-type dopant is doped in a process to be described below, the insulating portion 52 is masked by the light emitting element 30 and the first electrode CNE1 thereabove such that the insulating portion 52 is not doped with the N-type dopant, which makes it possible to maintain its insulating properties.

The electrode portion 54 may be a remaining area of the amorphous silicon layer 50 other than the insulating portion 52. The electrode portion 54 may be a region overlapping the first and second alignment electrodes 21 and 22. The electrode portion 54 includes amorphous silicon and may further include an N-type dopant. The N-type dopant may include at least one selected from among phosphorus (P), arsenic (As), and antimony (Sb). However, the present disclosure is not limited thereto, and the N-type dopant may include any one of Group 15 elements. The electrode portion 54 may include an N-type dopant having a concentration ranging from about $10^{15}/cm^3$ to about $10^{20}/cm^3$. The N-type dopant makes the electrode portion 54 of the amorphous silicon layer 50 conductive and may be included at a concentration of about $10^{15}/cm^3$ or more to make the electrode portion 54 conductive or may be included at a concentration of about $10^{20}/cm^3$ or less to prevent the conductivity from being lowered by the N-type dopant acting as a defect.

As shown in FIG. 5, in an embodiment, one end of the light emitting element 30 may be disposed on the insulating portion 52 of the amorphous silicon layer 50, and the other end of the light emitting element 30 may contact the electrode portion 54. One end of the light emitting element 30 may contact the first electrode CNE1 without contacting the insulating portion 52 of the amorphous silicon layer 50. The other end of the light emitting element 30 may contact the electrode portion 54 so that the conductive electrode portion 54 may act as the other electrode, for example, a second electrode that faces the first electrode CNE1.

The electrode portion 54 of the amorphous silicon layer 50 may have a relatively large thickness to contact the other end of the light emitting element 30. The electrode portion 54 may include an electrode contact portion 53 having a larger thickness than the other portion of the electrode portion 54. The electrode contact portion 53 may be formed by using a halftone mask after depositing a thick amorphous silicon layer. The electrode contact portion 53 may overlap a second alignment electrode layer 22' (see, e.g., FIG. 9) and may have a side surface that is perpendicular or substantially perpendicular to a target substrate SUB such that one end of the light emitting element 30 may be in contact therewith. In an embodiment, the thickness of the electrode contact portion 53 may be larger than the thickness of the insulating portion 52. The electrode contact portion 53 may have a large thickness to contact the entire other end of the light emitting element 30. In an embodiment, the top surface of the electrode contact portion 53 may coincide with the top surface of the light emitting element 30 in the horizontal direction.

In an embodiment, the amorphous silicon layer 50 is partially doped with an N-type dopant to form the insulating portion 52 and the electrode portion 54, thereby omitting a separate electrode connected to the other end of the light emitting element 30. Therefore, it is possible to reduce manufacturing cost and simplify the process by reducing the mask process for manufacturing a separate electrode.

The second bank BNL2 may be disposed on the amorphous silicon layer 50. The second bank BNL2 may include a portion extending in the first direction DR1 and the second direction DR2 in a plan view to be arranged in a grid pattern over the entire surface of the display area DPA. The second bank BNL2 may be disposed along the boundaries between the sub-pixels PXn to delimit the neighboring sub-pixels PXn.

Further, the second bank BNL2 may be disposed to surround (e.g., to extend around a periphery of) the emission area EMA and the cutout area CBA disposed for each sub-pixel PXn to delimit them from each other. The first alignment electrode 21 and the second alignment electrode 22 may extend in the second direction DR2 to be disposed across a portion of the second bank BNL2 extending in the first direction DR1. From among the portions of the second bank BNL2 extending in the second direction DR2, a portion disposed between the emission areas EMA may have a larger width than a portion disposed between the cutout areas CBA. Accordingly, the distance between the cutout areas CBA may be smaller than the distance between the emission areas EMA.

The second bank BNL2 may be formed to have a height greater than that of the first bank BNL1. The second bank BNL2 may prevent or substantially prevent ink from overflowing to the adjacent sub-pixels PXn during the inkjet printing process of the manufacturing process of the display device 10, thereby separating inks in which different light emitting elements 30 are dispersed for the corresponding sub-pixels PXn such that the inks are not mixed. Similar to the first bank BNL1, the second bank BNL2 may include polyimide (PI) but is not limited thereto.

The light emitting element 30 may be disposed on the amorphous silicon layer 50. The plurality of light emitting elements 30 may be disposed to be spaced apart from each other along the second direction DR2 in which the alignment electrodes 21 and 22 extend and may be aligned substantially parallel to each other. The light emitting element 30 may have a shape extending in one direction, and the extending direction of the light emitting element 30 may be substantially perpendicular to the extending direction of the alignment electrodes 21 and 22. However, the present disclosure is not limited thereto, and the light emitting element 30 may be disposed obliquely without being perpendicular to the extending direction of the alignment electrodes 21 and 22.

The light emitting elements 30 disposed in each sub-pixel PXn may include a light emitting layer (see, e.g., 36 in FIG. 3) including different materials to emit light of different wavelength bands to the outside. Accordingly, light of the first color, light of the second color, and light of the third color may be emitted from the first sub-pixel PX1, the second sub-pixel PX2, and the third sub-pixel PX3, respectively. However, the present disclosure is not limited thereto, and the sub-pixels PXn may include the light emitting elements 30 of the same type (e.g., including the same materials) to emit light of substantially the same color.

Between the first banks BNL1, the light emitting element 30 may have both ends respectively disposed above the alignment electrodes 21 and 22. The extending length of the light emitting element 30 may be longer than the distance between the first alignment electrode 21 and the second alignment electrode 22 such that both ends of the light emitting element 30 may be respectively disposed above the first alignment electrode 21 and the second alignment electrode 22. For example, the light emitting element 30 may be disposed such that one end is placed on the first alignment electrode 21 and the other end is placed on the second alignment electrode 22.

The light emitting element 30 may include a plurality of layers disposed in a direction parallel to the top surface of the substrate 11 or the first planarization layer 19. The light emitting element 30 may be disposed such that one extending direction is parallel to the top surface of the first planarization layer 19, and the plurality of semiconductor layers included in the light emitting element 30 may be sequentially arranged along a direction parallel to the top surface of the first planarization layer 19. However, the present disclosure is not limited thereto, and when the light emitting element 30 has a different structure, the plurality of semiconductor layers may be disposed in a direction perpendicular to the top surface of the first planarization layer 19.

One end of the light emitting element 30 may contact the first electrode CNE1 and the other end thereof may contact the electrode portion 54 of the amorphous silicon layer 50. For example, because the light emitting element 30 does not have the insulating layer (see, e.g., 38 in FIG. 3) formed on one end surface in the extending direction, and a portion of the semiconductor layer (see, e.g., 31, 32 in FIG. 3) or a portion of the electrode layer (see, e.g., 37 in FIG. 3) may be exposed, the exposed semiconductor layer may contact the first electrode CNE1 and the electrode portion 54. However, the present disclosure is not limited thereto, and at least a portion of the insulating layer 38 may be removed from the light emitting element 30 to partially expose the side surfaces at both ends of the semiconductor layers. The exposed side surfaces of the semiconductor layer may directly contact the first electrode CNE1 and the electrode portion 54.

The first insulating layer PAS1 may be partially disposed on the light emitting element 30. For example, the first insulating layer PAS1 may have a width smaller than the length of the light emitting element 30 and may be disposed on the light emitting element 30 to expose both ends of the light emitting element 30 while surrounding the light emitting element 30. During the manufacturing process of the display device 10, the first insulating layer PAS1 may be disposed to cover the light emitting element 30, the alignment electrodes 21 and 22, and the amorphous silicon layer 50 and then may be partially removed to expose both ends of the light emitting element 30. The first insulating layer PAS1 may be disposed to extend in the second direction DR2 on the amorphous silicon layer 50 in a plan view, thereby forming a linear or island-like pattern in each sub-pixel PXn. The first insulating layer PAS1 may protect the light emitting element 30 while fixing the light emitting element 30 during the manufacturing process of the display device 10.

The first electrode CNE1 may be disposed on the first insulating layer PAS1. The first electrode CNE1 may have a shape extending in one direction and may be disposed on the first alignment electrode 21. The first electrode CNE1 may be disposed to be spaced apart from and face the electrode portion 54 of the amorphous silicon layer 50. For example, the first electrode CNE1 and the electrode portion 54 of the amorphous silicon layer 50 may be disposed on the first alignment electrode 21 and the second alignment electrode 22, respectively, to be spaced apart from each other in the first direction DR1. The first electrode CNE1 may be formed in a stripe pattern in the emission area EMA of each sub-pixel PXn.

One side of the first electrode CNE1 contacting one end of the light emitting element 30 may be disposed on the first insulating layer PAS1. Further, the first electrode CNE1 may contact the first alignment electrode 21 through the opening OP in the amorphous silicon layer 50 exposing a portion of the top surface of the first alignment electrode 21. The bottom surface of the first electrode CNE1 may contact the top surface of the first alignment electrode 21. The bottom surface of the electrode portion 54 of the amorphous silicon layer 50 may be in full contact with the top surface of the second alignment electrode 22.

The first electrode CNE1 may include a transparent conductive material. For example, the first electrode CNE1 may include ITO, IZO, ITZO, aluminum (Al), or the like. Light emitted from the light emitting element 30 may pass through the first electrode CNE1.

Although an embodiment including one first electrode CNE1 and one electrode portion 54 disposed for one sub-pixel PXn is illustrated, the present disclosure is not limited thereto. The number of the first electrodes CNE1 and the number of the electrode portions 54 may vary depending on the number of the first and second alignment electrodes 21 and 22 disposed for each sub-pixel PXn.

A second insulating layer PAS2 may be entirely disposed in the display area DPA of the substrate 11. The second insulating layer PAS2 may function to protect the members disposed on the substrate 11 against the external environment. However, in some embodiments, the second insulating layer PAS2 may be omitted.

Each of the first insulating layer PAS1 and the second insulating layer PAS2 described above may include an inorganic insulating material or an organic insulating material. For example, the first insulating layer PAS1 and the second insulating layer PAS2 may include an inorganic insulating material, such as silicon oxide ($SiO_x$), silicon nitride ($SiN_x$), silicon oxynitride ($SiO_xN_y$), aluminum oxide ($Al_2O_3$), aluminum nitride (AlN), and the like. Alternatively, they may include an organic insulating material, such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethylmethacrylate, polycarbonate, polymethylmethacrylate-polycarbonate synthetic resin, and the like. However, the present disclosure is not limited thereto.

Hereinafter, a manufacturing process of the display device 10 according to an embodiment will be described.

Figure 6:
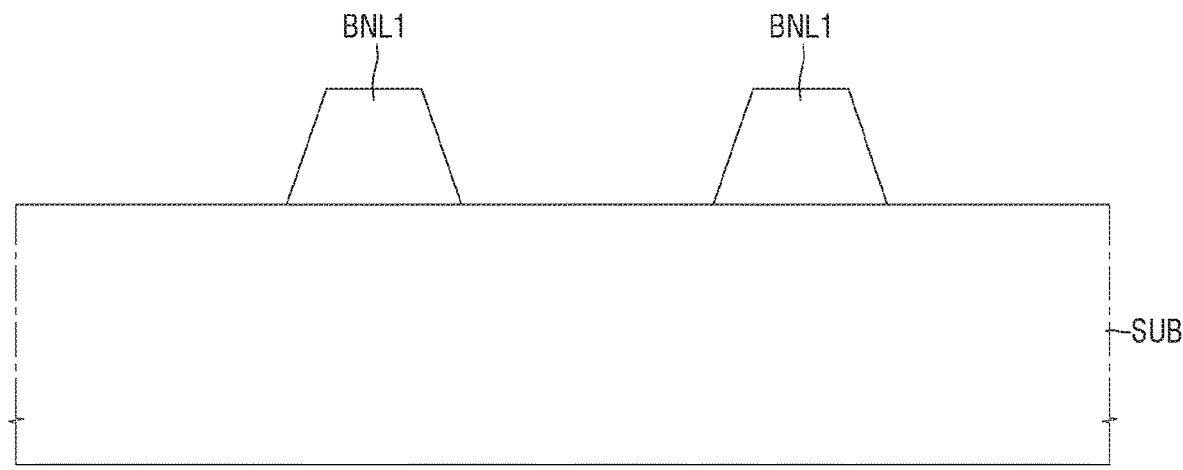
FIGS. 6 and 7 are cross-sectional views illustrating aspects of a manufacturing process of a display device according to an embodiment.
Figure 6:
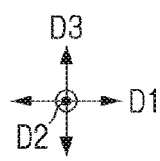
Figure 7:
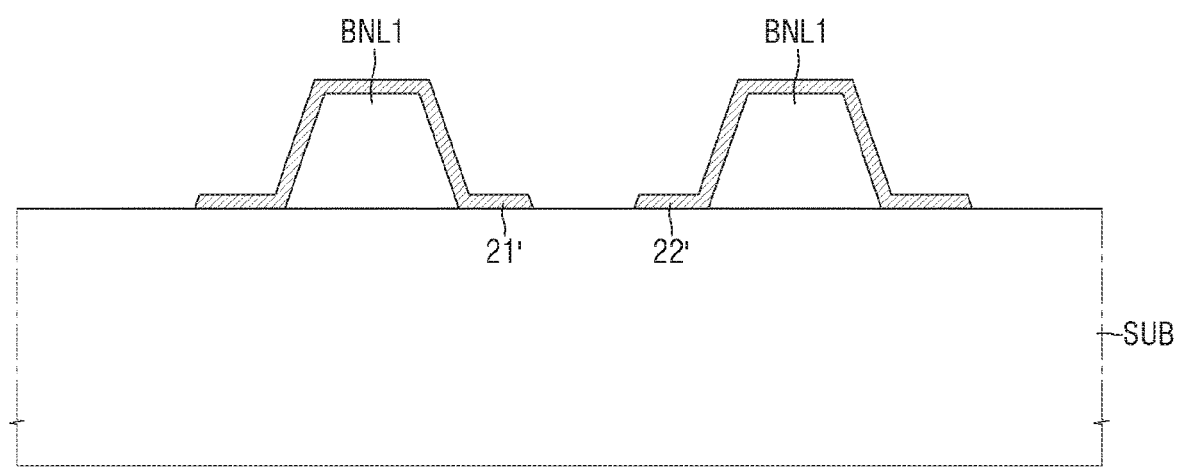
Figure 7:
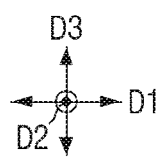
Figure 8:
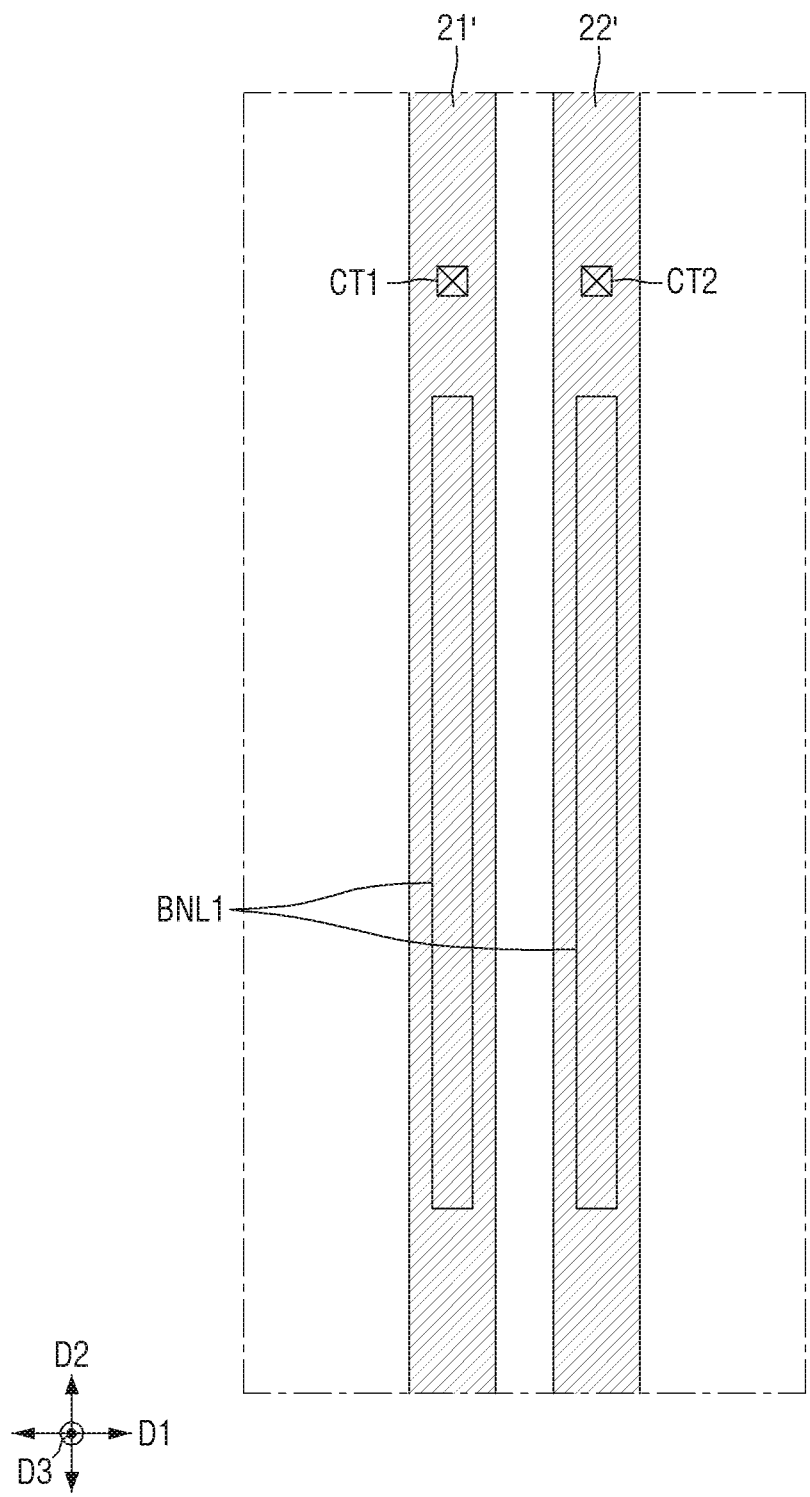
FIG. 8 is a plan view illustrating one sub-pixel in the manufacturing process shown in FIG. 7.

FIGS. 6 and 7 are cross-sectional views illustrating aspects of a manufacturing process of a display device according to an embodiment. FIG. 8 is a plan view illustrating one sub-pixel in the manufacturing process shown in FIG. 7.

A method for manufacturing a display device according to an embodiment may include: preparing a target substrate SUB including a first alignment electrode 21 and a second alignment electrode 22; forming an amorphous silicon layer 50 on the target substrate SUB; aligning a light emitting element 30 on the amorphous silicon layer 50; forming a first insulating layer PAS1 on the light emitting element 30; forming a first electrode CNE1 on one end of the light emitting element 30 and the amorphous silicon layer 50; and forming an insulating portion 52 and an electrode portion 54 by doping an N-type dopant into the amorphous silicon layer 50.

First, referring to FIG. 6, the target substrate SUB is prepared. The target substrate SUB may be (or may include) the substrate 11 described above including circuit elements including a plurality of conductive layers and a plurality of insulating layers. Hereinafter, for simplicity of description, it will be described in conjunction with the target substrate SUB including them.

Subsequently, a plurality of first banks BNL1 are formed to be spaced apart from each other on the target substrate SUB. The first bank BNL1 may have a shape protruding from the top surface of the target substrate SUB. A description thereof is provided above.

Next, referring to FIGS. 7 and 8, a first alignment electrode layer 21' and a second alignment electrode layer 22' are formed to be disposed on the first banks BNL1. The first alignment electrode layer 21' and the second alignment electrode layer 22' extend in the second direction DR2 and are spaced apart from each other. The first alignment electrode layer 21' and the second alignment electrode layer 22' may extend in the second direction DR2 during the manufacturing process of the display device 10 and may also be disposed in another sub-pixel PXn. After disposing the light emitting element 30 in a subsequent process, a disconnection process of separating the first alignment electrode layer 21' and the second alignment electrode layer 22' in the cutout area CBA of each sub-pixel PXn may be performed to form the first alignment electrode 21 and the second alignment electrode 22, respectively. The first alignment electrode layer 21' and the second alignment electrode layer 22' may contact the above-described circuit elements through a first contact opening CT1 and a second contact opening CT2 formed in the target substrate SUB (e.g., formed in some layers of the target substrate SUB).

Figure 9:
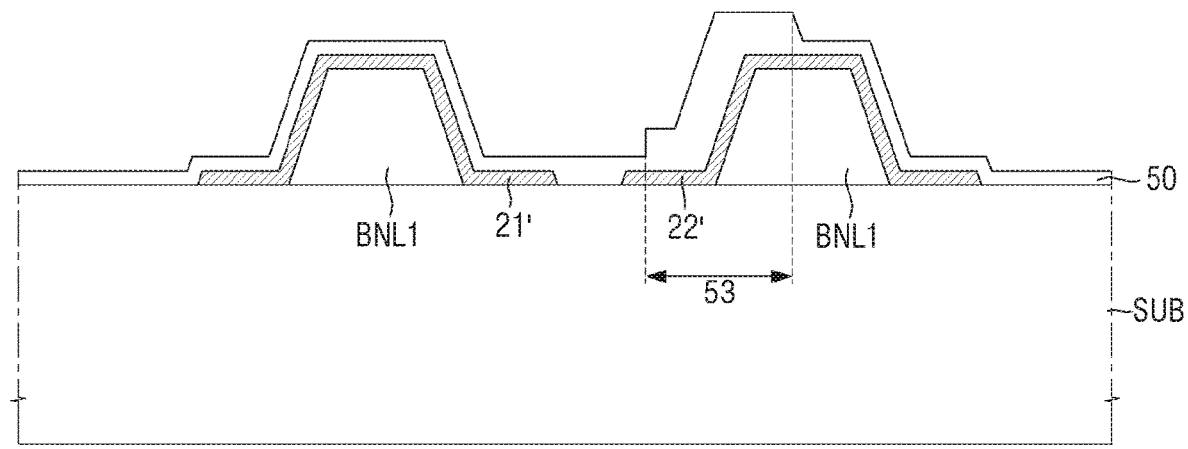
FIGS. 9 and 10 are cross-sectional views illustrating aspects of a manufacturing process of a display device according to an embodiment.
Figure 10:
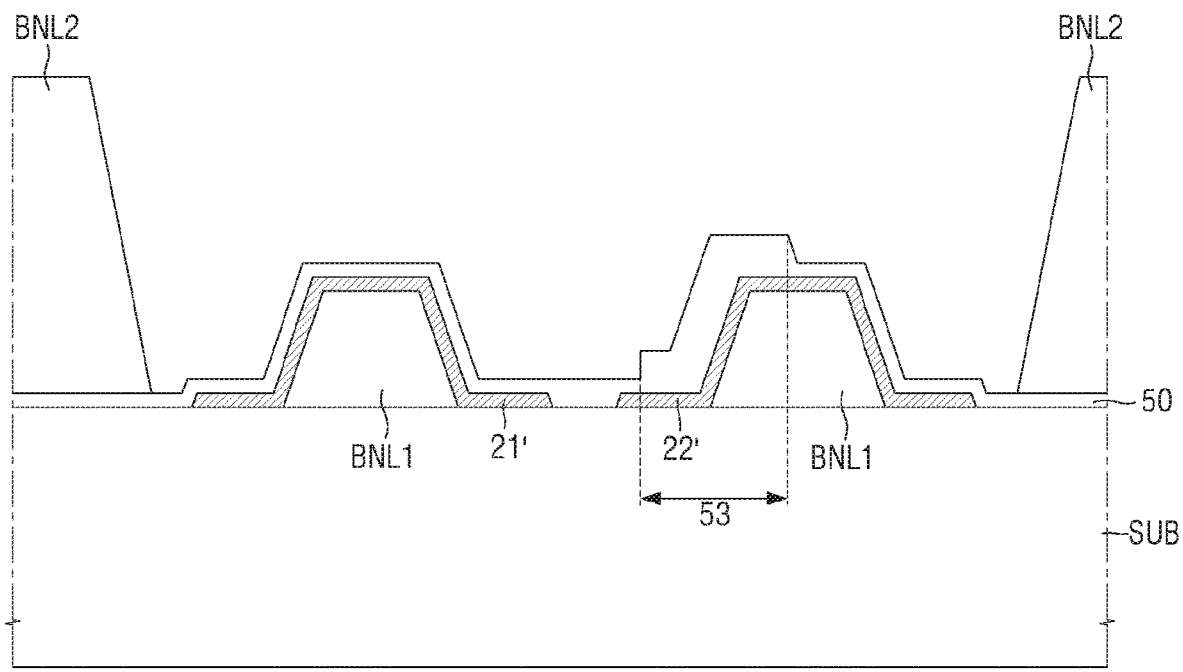
Figure 11:
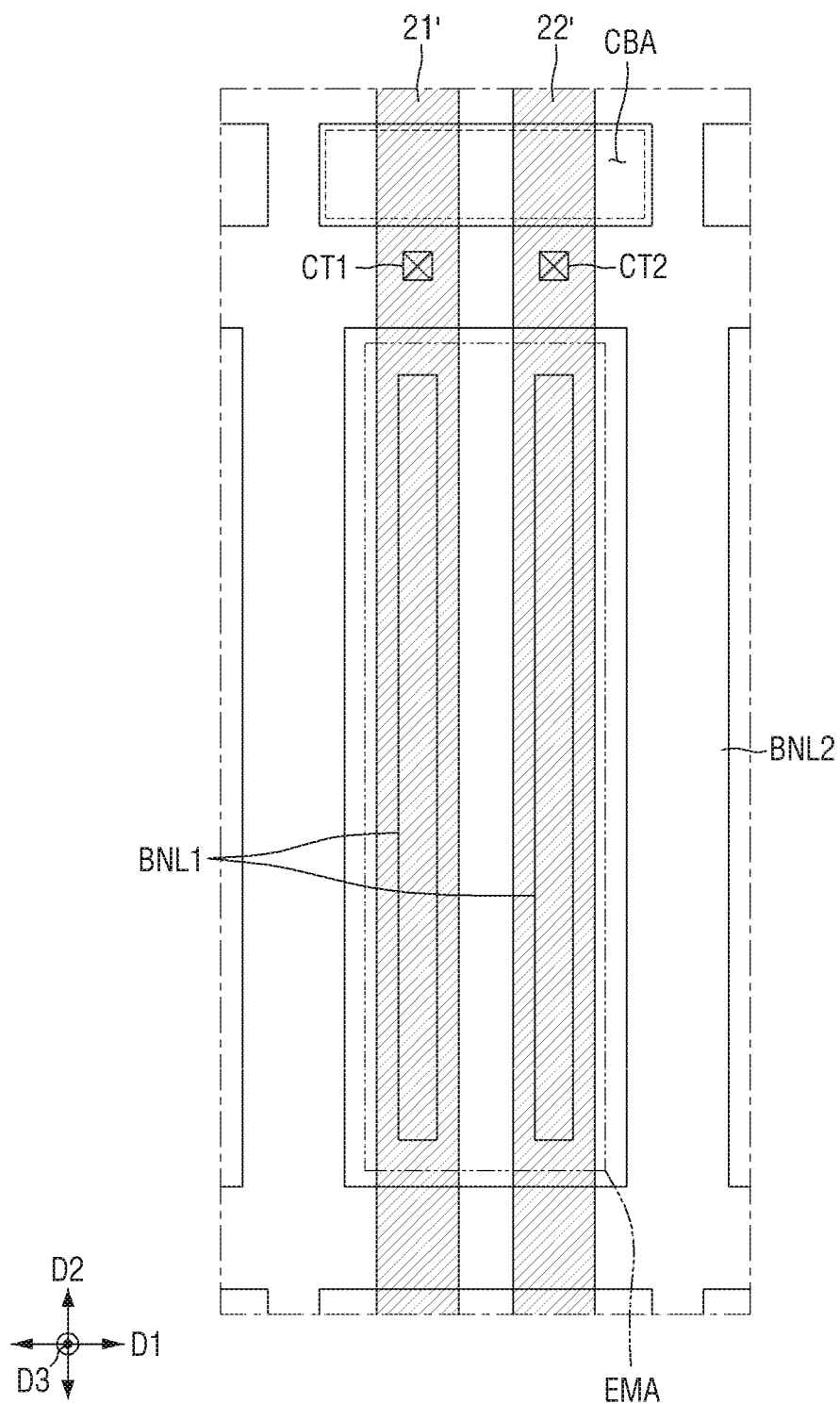
FIG. 11 is a plan view illustrating a sub-pixel in one step of a manufacturing process of a display device according to an embodiment.

FIGS. 9 and 10 are cross-sectional views illustrating aspects of a manufacturing process of a display device according to an embodiment. FIG. 11 is a plan view illustrating a sub-pixel in one step of a manufacturing process of a display device according to an embodiment.

Referring to FIGS. 9 to 11, an amorphous silicon layer 50 is formed to cover the first alignment electrode layer 21' and the second alignment electrode layer 22'. The amorphous silicon layer 50 may be entirely disposed on the target substrate SUB to cover the first alignment electrode layer 21' and the second alignment electrode layer 22'. The amorphous silicon layer 50 may be partially removed in a subsequent process such that the top surface of the first alignment electrode layer 21' is exposed to form the amorphous silicon layer 50.

The amorphous silicon layer 50 may be formed to have a large thickness in a partial region by using a halftone mask after depositing a thick amorphous silicon layer. In an embodiment, an electrode contact portion 53 is formed by forming a partial region of the amorphous silicon layer 50 that overlaps the second alignment electrode layer 22' to have a large thickness. The electrode contact portion 53 may have a side surface perpendicular or substantially perpendicular to the target substrate SUB so that one end of the light emitting element 30, to be described in more detail below, may be in contact therewith.

Subsequently, a second bank BNL2 is formed, which is disposed on the amorphous silicon layer 50 and surrounds the emission area EMA and the cutout area CBA of each sub-pixel PXn. The second bank BNL2 may be disposed so as to surround (e.g., to extend around a periphery of) each sub-pixel PXn to distinguish the sub-pixels PXn from each other, while distinguishing the emission area EMA from the cutout area CBA. A description thereof is provided above.

Figure 12:
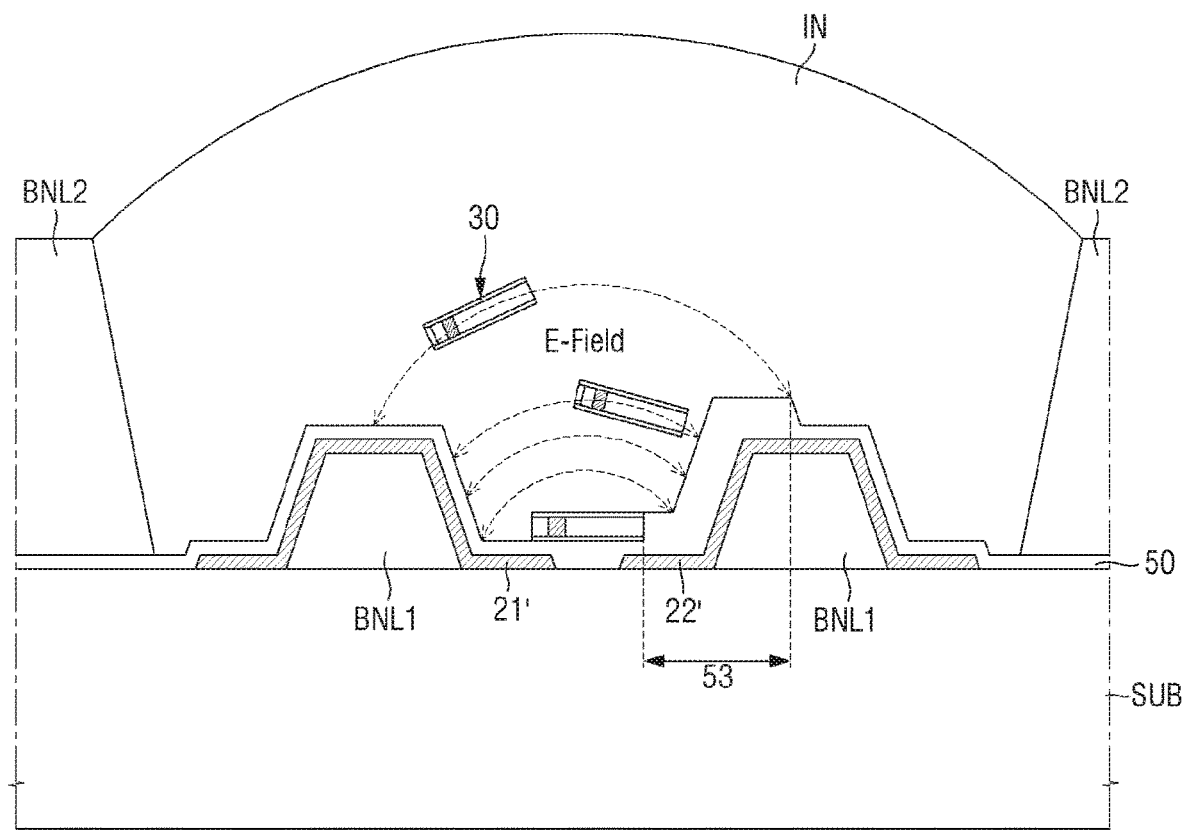
FIG. 12 is a schematic cross-sectional view illustrating an arrangement of light emitting elements in a manufacturing process of a display device according to an embodiment.
Figure 13:
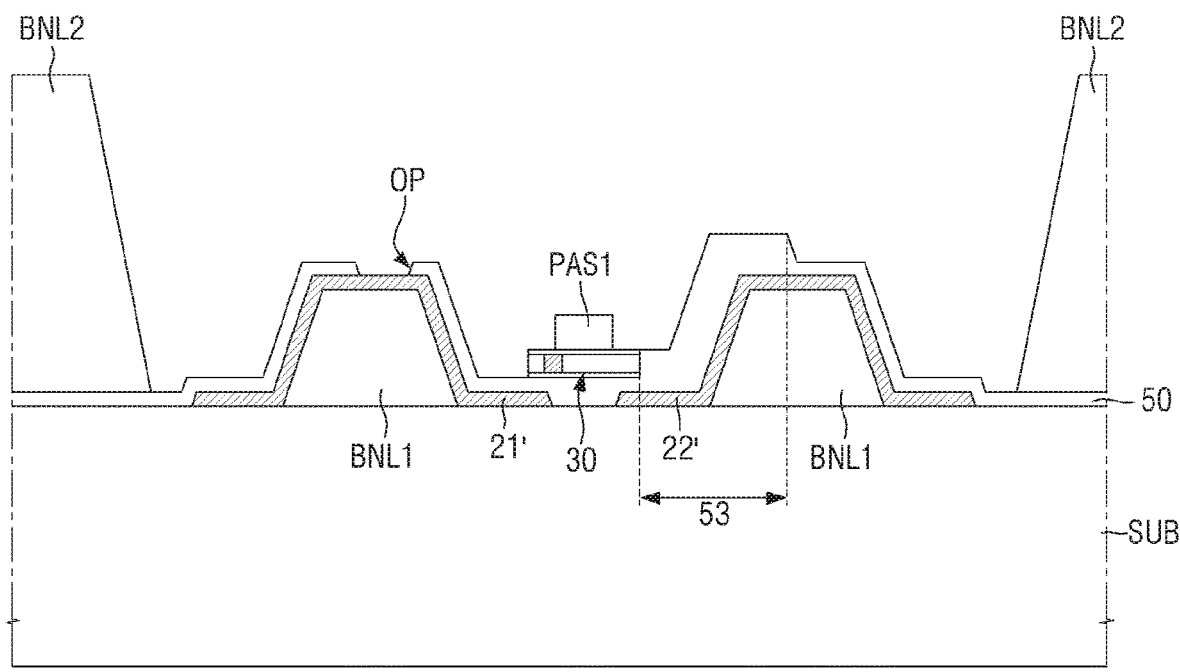
FIG. 13 is a cross-sectional view partially illustrating a manufacturing process of a display device according to an embodiment.
Figure 14:
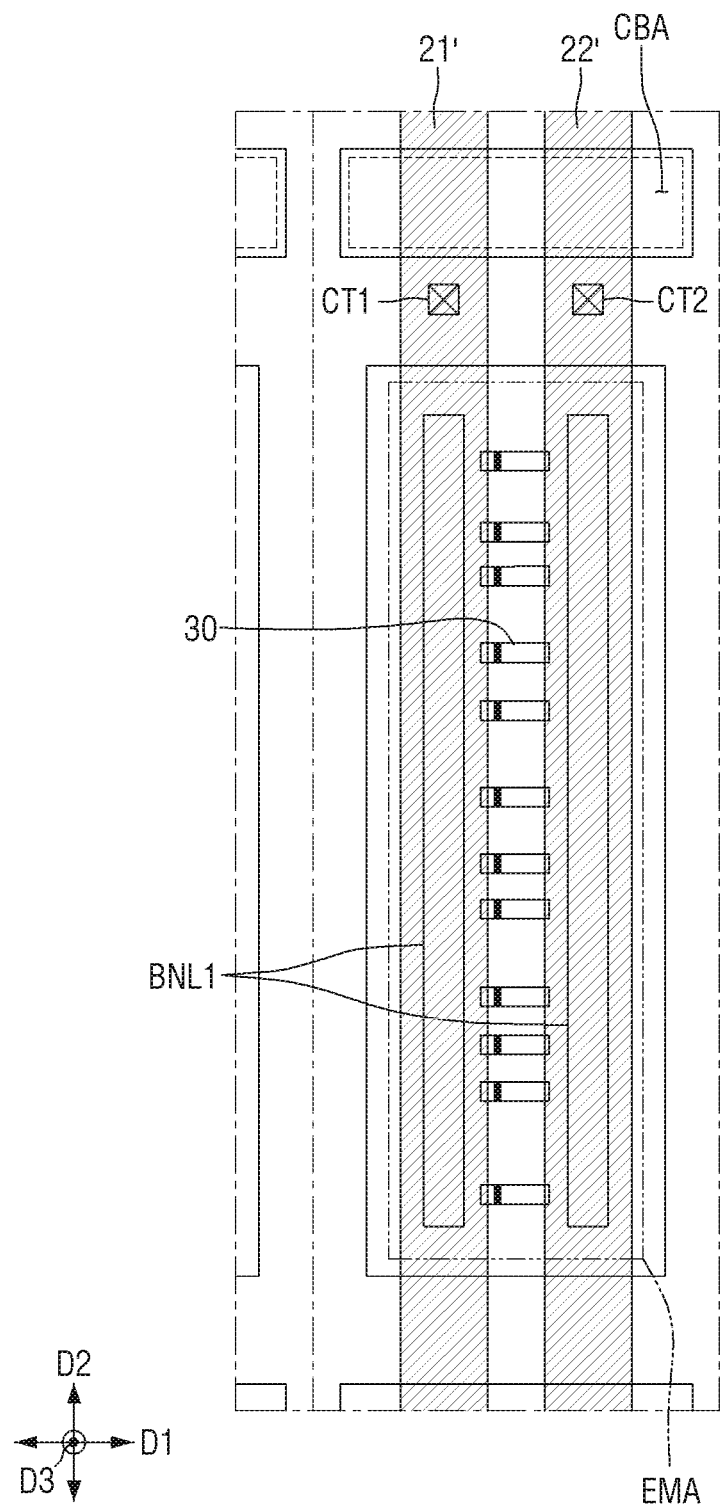
FIG. 14 is a plan view illustrating a sub-pixel in one step of a manufacturing process of a display device according to an embodiment.

FIG. 12 is a schematic cross-sectional view illustrating an arrangement of light emitting elements in a manufacturing process of a display device according to an embodiment. FIG. 13 is a cross-sectional view illustrating aspects of a manufacturing process of a display device according to an embodiment. FIG. 14 is a plan view illustrating a sub-pixel in one step of a manufacturing process of a display device according to an embodiment.

Next, referring to FIG. 12, a plurality of light emitting elements 30 are disposed between the first banks BNL1. Opposite ends of the light emitting element 30 may be disposed on the first alignment electrode layer 21' and the second alignment electrode layer 22' on the amorphous silicon layer 50, respectively. The light emitting elements 30 may be injected onto the target substrate SUB in a state of being dispersed in ink IN. In an embodiment, the light emitting elements 30 are prepared in a state of being dispersed in the ink IN including (or containing) a solvent and may be injected (e.g., deposited or printed) onto the target substrate SUB through a printing process using an inkjet printing device. The ink injected through the inkjet printing device may be settled in an area surrounded by (e.g., bounded by) the second bank BNL2. The second bank BNL2 may prevent the ink IN from overflowing to the neighboring sub-pixel PXn.

As shown in FIG. 12, when the ink IN including the light emitting elements 30 is sprayed, the plurality of light emitting elements 30 are disposed on the amorphous silicon layer 50 by applying an electrical signal to the first alignment electrode layer 21' and the second alignment electrode layer 22'.

When an electrical signal, e.g., current, is allowed to flow through the first alignment electrode layer 21' and the second alignment electrode layer 22', an electric field (E-Field) may be generated on (or between) the first alignment electrode layer 21' and the second alignment electrode layer 22'. When an alternating current signal is applied to one of the first alignment electrode layer 21' and the second alignment electrode layer 22', a dipole moment is generated in the light emitting elements 30 dispersed in the ink IN. In response to the generated electric field, a rotation torque (TDEP) is generated to align the light emitting elements 30 in which the dipole moment has been generated. In addition, the light emitting element 30 may be subjected to a dielectrophoretic force (FDEP) by the electric field. The light emitting element 30 having been subjected to the dielectrophoretic force may move to a side where the electric field intensity is relatively large such that opposite ends thereof are placed on the first alignment electrode layer 21' and the second alignment electrode layer 22', respectively.

As shown in FIG. 12, the light emitting element 30 placed on the amorphous silicon layer 50 may contact the electrode contact portion 53 of the amorphous silicon layer 50. In this case, the first semiconductor layer (see, e.g., 31 in FIG. 3) including an N-type semiconductor of the light emitting element 30 may contact the electrode contact portion 53. The second semiconductor layer (see, e.g., 32 in FIG. 3) including a P-type semiconductor of the light emitting element 30 may be aligned on the first alignment electrode layer 21'.

A portion of the light emitting element 30 may be spaced apart from the electrode contact portion 53 of the amorphous silicon layer 50. In order to ensure that a portion of the light emitting element 30 is spaced apart from the electrode contact portion 53, a positive voltage may be applied to the second alignment electrode layer 22'. When a positive voltage is applied to the second alignment electrode layer 22', the first semiconductor layer (see, e.g., 31 in FIG. 3) of the light emitting element 30 is pulled to (or toward) the second alignment electrode layer 22' so that it may contact the electrode contact portion 53.

FIG. 13 is a cross-sectional view illustrating aspects of a manufacturing process of a display device according to an embodiment. FIG. 14 is a plan view illustrating a sub-pixel in one step of a manufacturing process of a display device according to an embodiment.

Next, referring to FIG. 13, an opening OP is formed in the amorphous silicon layer 50 by partially removing the amorphous silicon layer 50 such that the top surface of the first alignment electrode layer 21' is exposed therethrough. The first alignment electrode layer 21' exposed through the opening OP may contact the first electrode CNE1, which is described in more detail below.

Next, referring to FIG. 14, a process of disconnecting portions of the first alignment electrode layer 21' and the second alignment electrode layer 22' disposed in the cutout areas CBA is performed to form the first alignment electrode 21 and the second alignment electrode 22.

Figure 15:
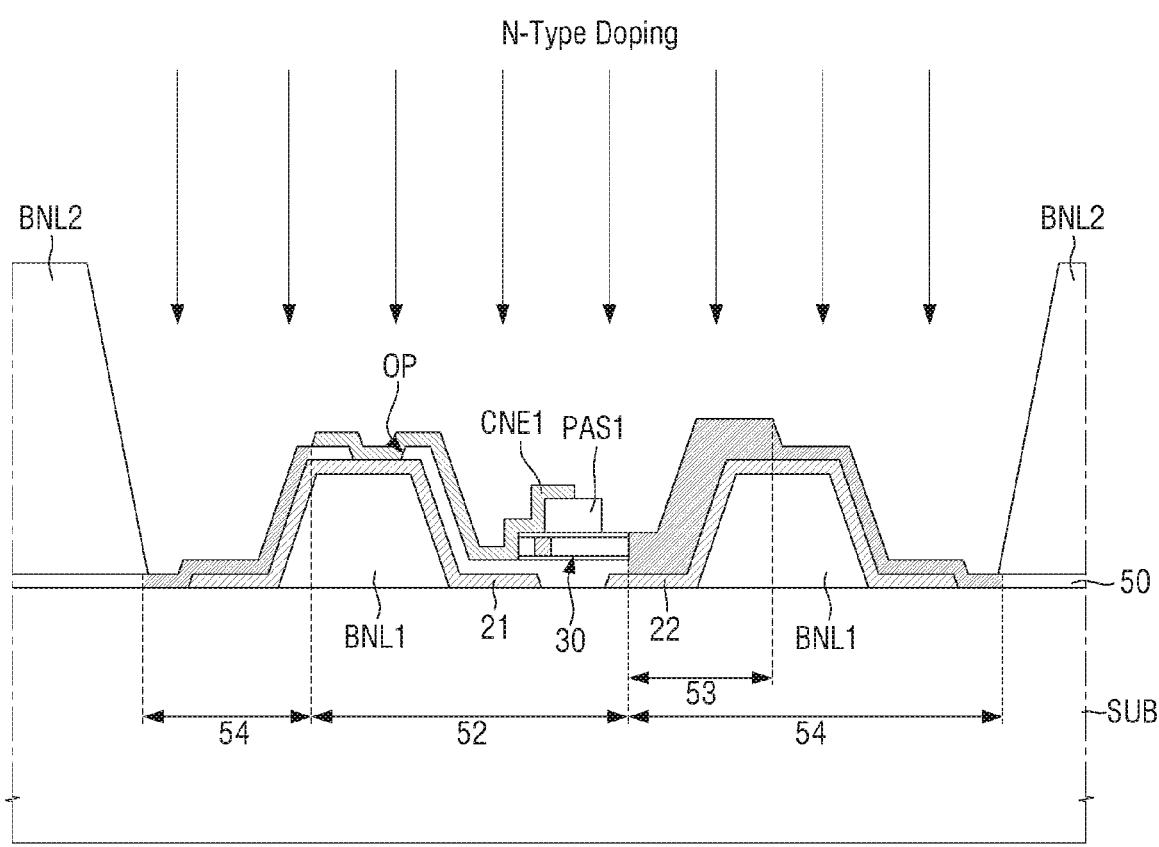
FIGS. 15 and 16 are cross-sectional views illustrating aspects of a manufacturing process of a display device according to an embodiment.
Figure 16:
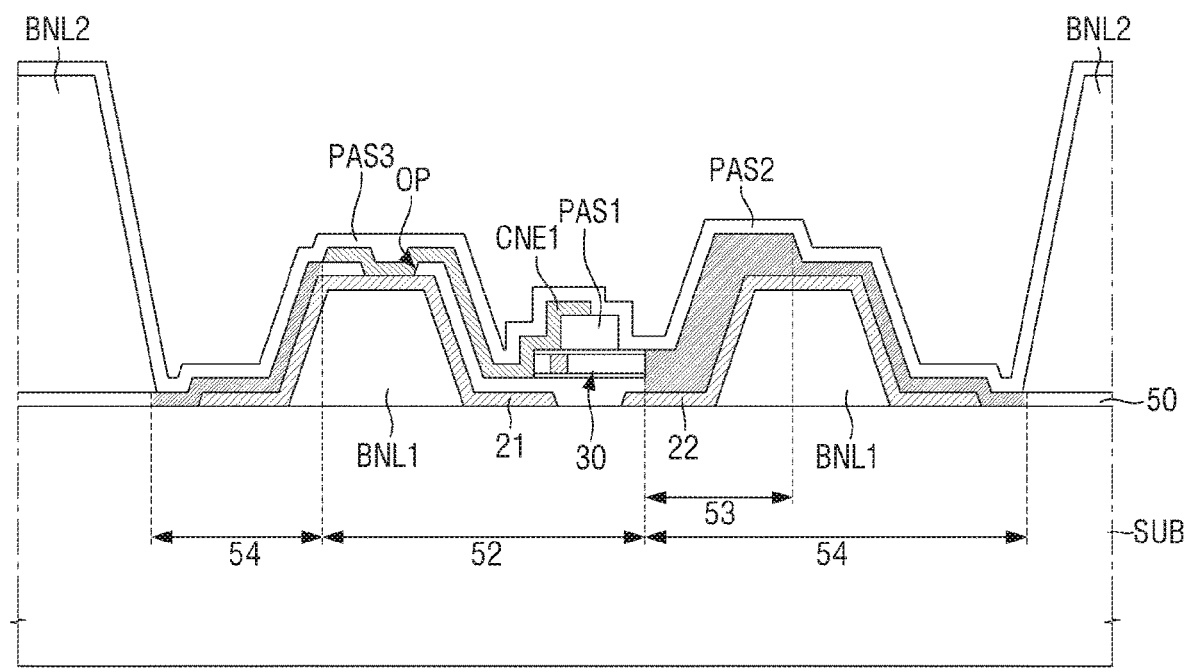

FIGS. 15 and 16 are cross-sectional views illustrating aspects of a manufacturing process of a display device according to an embodiment.

Next, referring to FIG. 15, a first insulating layer PAS1 is formed on the light emitting element 30. The first insulating layer PAS1 may overlap the light emitting element 30 and extend in the second direction DR2. Subsequently, the first electrode CNE1 is formed on the amorphous silicon layer 50, the light emitting element 30, and the first insulating layer PAS1. The first electrode CNE1 may overlap the amorphous silicon layer 50, the light emitting element 30, and the first insulating layer PAS1. The first electrode CNE1 may contact the first alignment electrode 21 through the opening OP in the amorphous silicon layer 50. The first electrode CNE1 may contact one end of the light emitting element 30 and one end of the first insulating layer PAS1.

Next, an N-type dopant is doped into the target substrate SUB. The N-type dopant may be doped into a portion of the amorphous silicon layer 50. For example, the amorphous silicon layer 50 doped with the N-type dopant may be conductorized (e.g., may be made conductive) by the N-type dopant. The amorphous silicon layer 50 doped with the N-type dopant may be an electrode portion 54. The amorphous silicon layer 50 that is masked by the first electrode CNE1 and the light emitting element 30 and is not doped with the N-type dopant may be an insulating portion 52.

The N-type dopant may include at least one selected from among phosphorus (P), arsenic (As), and antimony (Sb). However, the present disclosure is not limited thereto, and the N-type dopant may include any one of Group 15 elements. The electrode portion 54 may be doped at a concentration ranging from about $10^{15}/cm^3$ to about $10^{20}/cm^3$. After the doping of the N-type dopant is completed, the target substrate SUB is heat-treated to activate the N-type dopant so that the electrode portion 54 of the amorphous silicon layer 50 may be made conductive.

Accordingly, one end of the light emitting element 30 may contact the first electrode CNE1 and the other end of the light emitting element 30 may contact the electrode portion 54 of the amorphous silicon layer 50. The electrode portion 54 may function as a second electrode for applying a current to the other end of the light emitting element 30.

Next, referring to FIG. 16, a display device according to an embodiment is manufactured by forming a second insulating layer PAS2 on the target substrate SUB.

Figure 17:
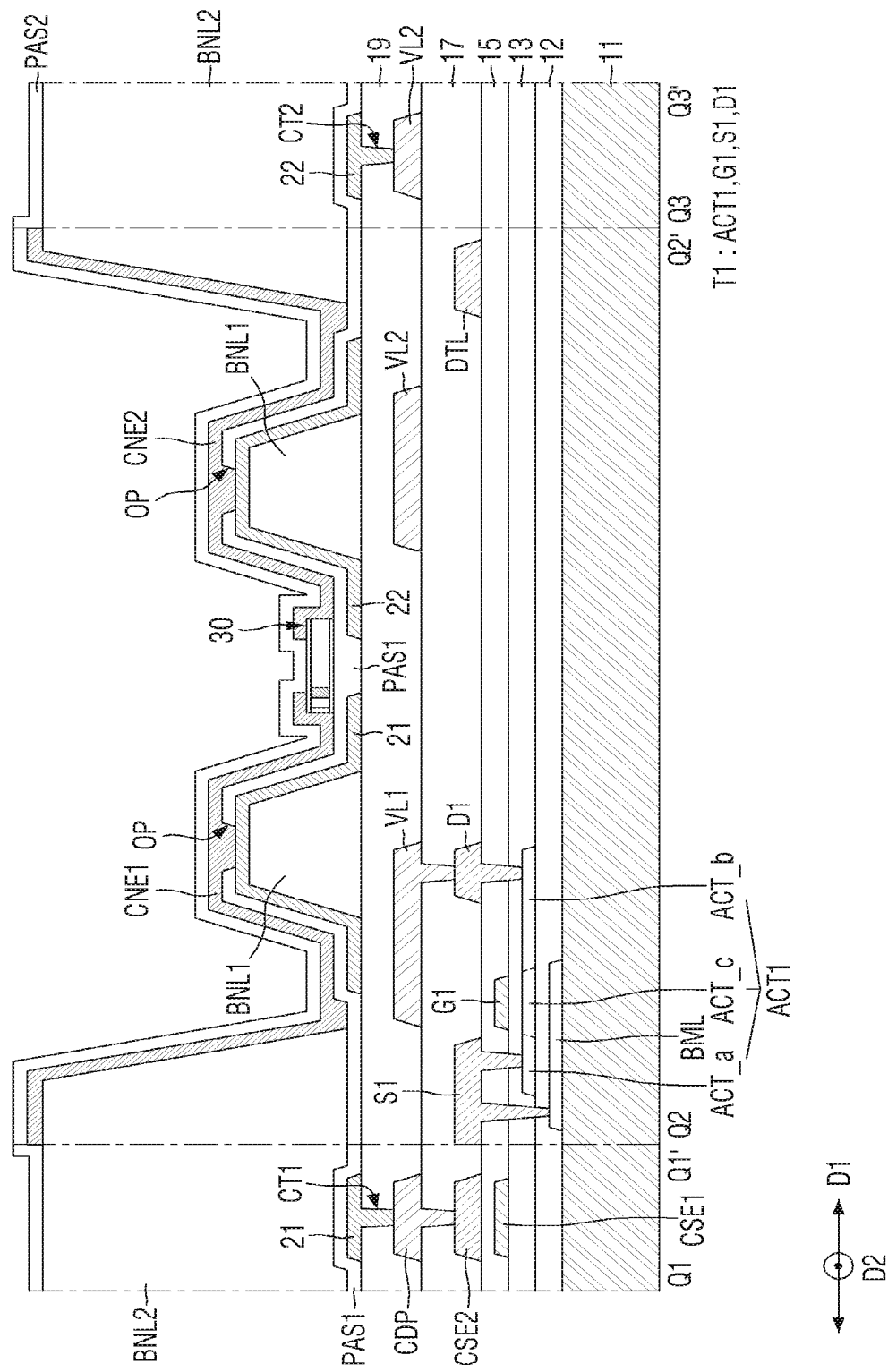
FIG. 17 is a cross-sectional view illustrating a display device according to another embodiment.

FIG. 17 is a cross-sectional view illustrating a display device according to another embodiment.

The embodiment shown in FIG. 17 is different from the embodiment shown in FIG. 4 in that it includes a first electrode and a second electrode formed of an amorphous silicon layer. In the following, descriptions that are the same or substantially similar as the description above with reference to FIG. 4 may be omitted while differences therebetween will be primarily described in detail.

Referring to FIG. 17, a plurality of first banks BNL1, a plurality of alignment electrodes 21 and 22, the light emitting element 30, and the second bank BNL2 may be disposed on a first planarization layer 19. In addition, an insulating layer PAS1 may be disposed on the first planarization layer 19. The plurality of alignment electrodes 21 and 22 may be disposed on the first bank BNL1 and the first planarization layer 19. The plurality of alignment electrodes 21 and 22 may include a first alignment electrode 21 and a second alignment electrode 22.

The first insulating layer PAS1 is disposed on the first planarization layer 19. The first insulating layer PAS1 may be disposed to cover the first banks BNL1 and the first and second alignment electrodes 21 and 22. The first insulating layer PAS1 may protect the first alignment electrode 21 and the second alignment electrode 22 and insulate them from each other. Further, the light emitting element 30 disposed on the first insulating layer PAS1 may not be damaged by direct contact with other members.

In an embodiment, the first insulating layer PAS1 may have an opening OP partially exposing the first alignment electrode 21 and the second alignment electrode 22. Each opening OP may partially expose a portion of the first alignment electrode 21 and the second alignment electrode 22 disposed on the top surface of the first bank BNL1. A portion of the first electrode CNE1 and the second electrode CNE2 may contact the first alignment electrode 21 and the second alignment electrode 22 exposed through the respective openings OP.

The light emitting element 30 may be disposed on the first insulating layer PAS1. In addition, the first electrode CNE1 and the second electrode CNE2 may be disposed on the first insulating layer PAS1 and the light emitting element 30. The first electrode CNE1 and the second electrode CNE2 may be spaced apart from each other and disposed to face each other. For example, the first electrode CNE1 and the second electrode CNE2 may be disposed on the first alignment electrode 21 and the second alignment electrode 22, respectively, to be spaced apart from each other in the first direction DR1.

The first electrode CNE1 and the second electrode CNE2 may each contact the light emitting element 30. The first electrode CNE1 may contact one end of the light emitting element 30, and the second electrode CNE2 may contact the other end of the light emitting element 30. In addition, the first electrode CNE1 may contact the first alignment electrode 21 through the opening OP exposing a portion of the top surface of the first alignment electrode 21, and the second electrode CNE2 may contact the second alignment electrode 22 through the opening OP exposing a portion of the top surface of the second alignment electrode 22.

The first electrode CNE1 and the second electrode CNE2 may be disposed not only to contact one end and the other end of the light emitting element 30, respectively, but also to cover a portion of the top surface of the first alignment electrode 21 and a portion of the top surface of the second alignment electrode 22, respectively. Further, the first electrode CNE1 and the second electrode CNE2 may be disposed to cover the top surface of the first bank BNL2.

The first electrode CNE1 and the second electrode CNE2 described above may include amorphous silicon. The first electrode CNE1 may include a P-type dopant, the second electrode CNE2 may include an N-type dopant, and each may function as a conductive electrode.

The P-type dopant may include any one selected from among boron (B), aluminum (Al), gallium (Ga), and indium (In). The N-type dopant may include at least one selected from among phosphorus (P), arsenic (As), and antimony (Sb). However, the present disclosure is not limited thereto, and the P-type dopant may include any one of Group 13 elements, and the N-type dopant may include any one of Group 15 elements. The first electrode CNE1 may include a P-type dopant having a concentration in a range of about $10^{15}/cm^3$ to about $10^{20}/cm^3$, and the second electrode CNE2 may include an N-type dopant having a concentration in a range of about $10^{15}/cm^3$ to about $10^{20}/cm^3$.

In an embodiment, the first electrode CNE1 including (or formed of) amorphous silicon is doped with a P-type dopant, and the second electrode CNE2 is doped with an N-type dopant to form them as electrodes. Thus, separate electrodes and insulating layers connected to one end and the other end of the light emitting element 30 may be omitted. Therefore, it is possible to reduce manufacturing cost and simplify the process by reducing the mask process for manufacturing separate electrodes and insulating layers.

Hereinafter, a manufacturing process of the display device 10 according to another embodiment illustrated in FIG. 17 will be described. In the following, descriptions that are the same or substantially similar as those with respect to the manufacturing process of the embodiment illustrated in FIGS. 6 to 16 may be omitted.

FIGS. 18 to 23 are cross-sectional views partially illustrating a manufacturing process of a display device according to another embodiment.

A method for manufacturing a display device according to another embodiment may include: forming a first insulating layer PAS1 on a target substrate SUB including a first alignment electrode 21 and a second alignment electrode 22; aligning a light emitting element 30 on the first insulating layer PAS1; forming an opening OP in the first insulating layer PAS1; forming an amorphous silicon layer 50 covering the light emitting element 30 on the target substrate SUB; forming a first mask pattern MS1 overlapping the second alignment electrode 22 and doping it with a P-type dopant; removing the first mask pattern MS1; forming a second mask pattern MS3 overlapping the first alignment electrode 21 and doping it with an N-type dopant; and removing a portion of the amorphous silicon layer 50 overlapping the light emitting element 30 to form a first electrode CNE1 contacting one end of the light emitting element 30 and a second electrode CNE2 contacting the other end of the light emitting element 30.

Figure 18:
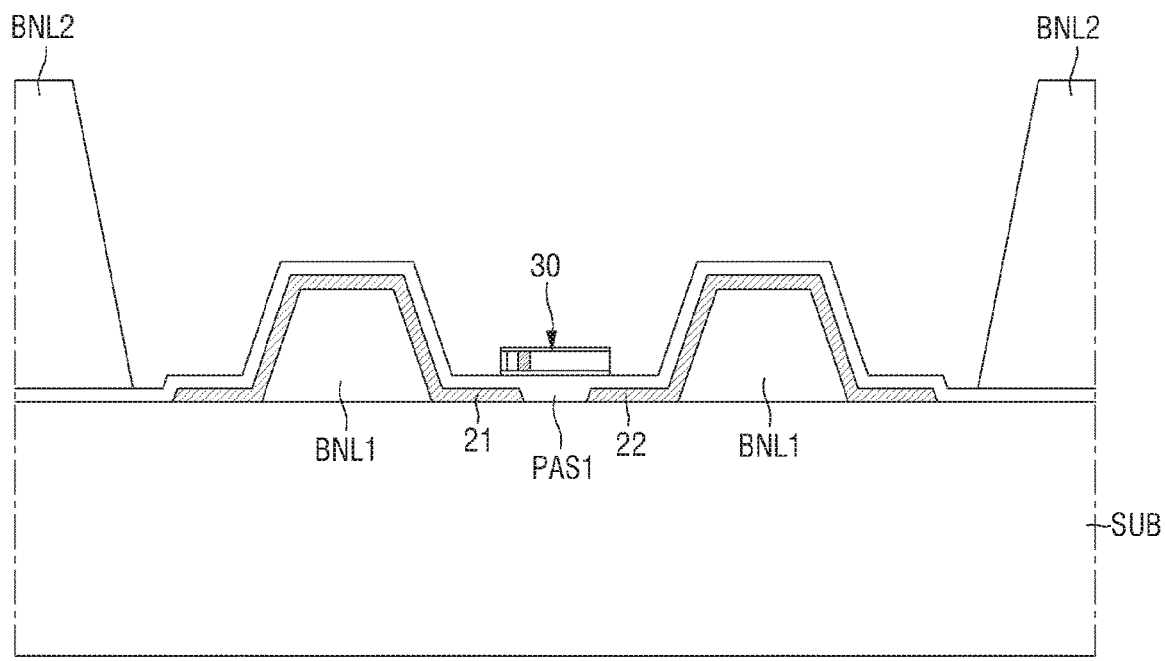
FIGS. 18 to 23 are cross-sectional views illustrating aspects of a manufacturing process of a display device according to another embodiment.

First, referring to FIG. 18, a plurality of first banks BNL1 are formed on a target substrate SUB to be spaced apart from each other, and a first alignment electrode layer 21' and a second alignment electrode layer 22' are formed to be disposed on the first banks BNL1. A first insulating layer PAS1 is formed to cover the first alignment electrode layer 21' and the second alignment electrode layer 22', and a plurality of second banks BNL2 are formed to be spaced apart from each other. Subsequently, the light emitting element 30 is aligned on the first insulating layer PAS1.

Figure 19:
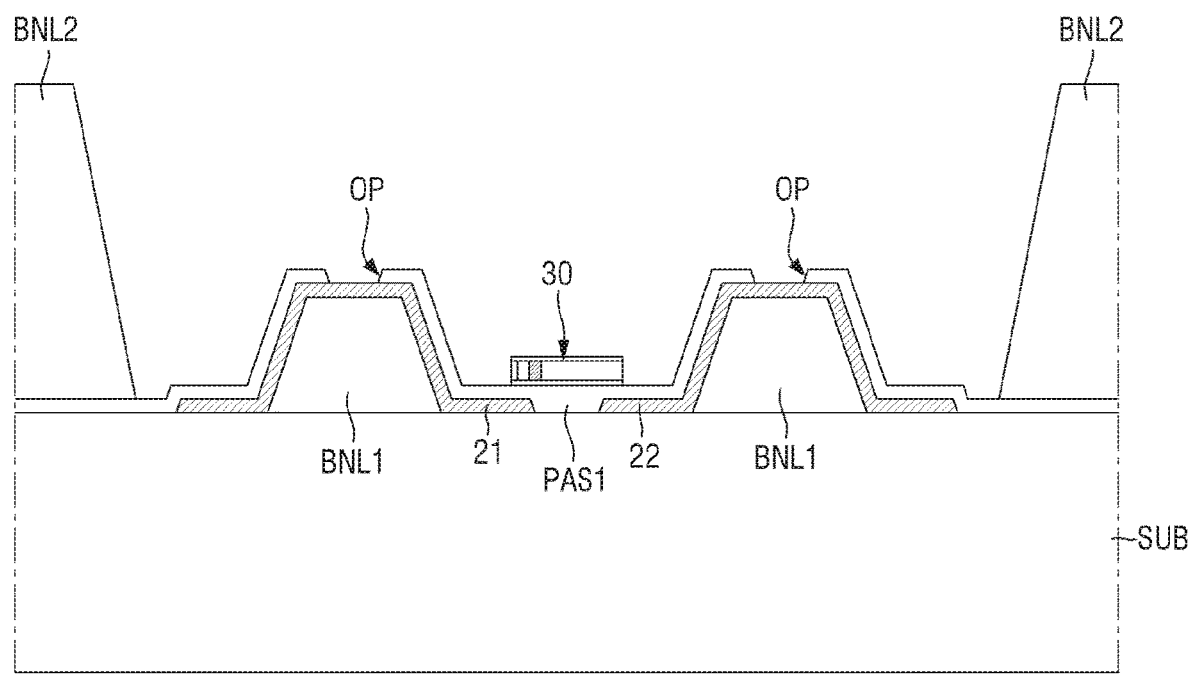

Next, referring to FIG. 19, a plurality of openings OP are formed by partially etching the first insulating layer PAS1. For example, an opening OP (e.g., a first opening) exposing the first alignment electrode 21 is formed by etching a portion of the first insulating layer PAS1 overlapping the first alignment electrode 21. An opening OP (e.g., a second opening) exposing the second alignment electrode 22 is formed by etching a portion of the first insulating layer PAS1 overlapping the second alignment electrode 22.

Figure 20:
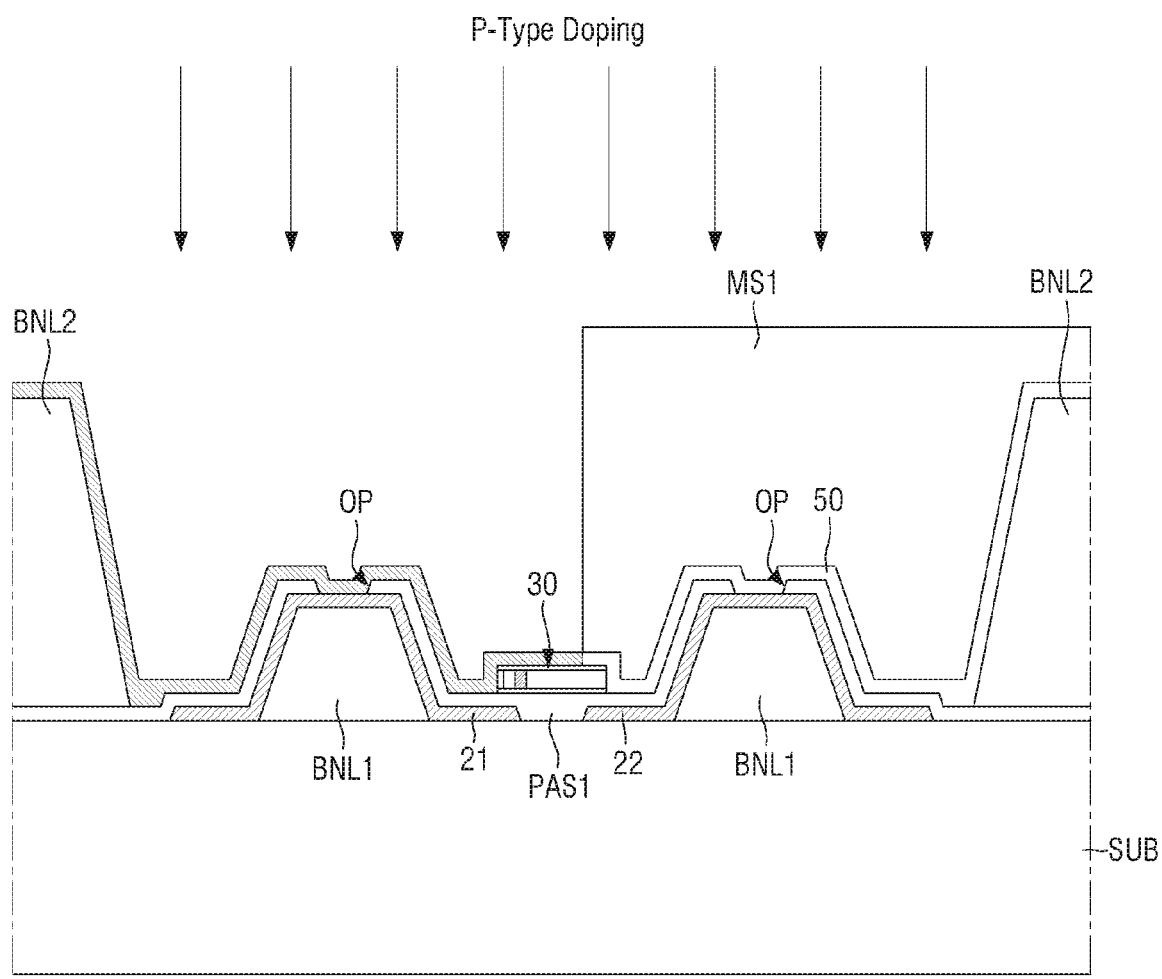

Next, referring to FIG. 20, an amorphous silicon layer 50 is formed on the target substrate SUB. In addition, a first mask pattern MS1 is formed on the amorphous silicon layer 50. The first mask pattern MS1 may be formed to overlap the light emitting element 30, the second alignment electrode 22, and the second bank BNL adjacent to the second alignment electrode 22. In an embodiment, the first mask pattern MS1 is formed in a direction toward the second alignment electrode 22 with respect to the center of the light emitting element 30 in one pixel. Accordingly, the amorphous silicon layer 50 in the direction toward the first alignment electrode 21 with respect to the center of the light emitting element 30 is exposed.

Then, a P-type dopant is doped into the target substrate SUB. The P-type dopant may be doped into the amorphous silicon layer 50 exposed by the first mask pattern MS1. For example, the amorphous silicon layer 50 doped with the P-type dopant may be conductorized by the P-type dopant. The amorphous silicon layer 50 doped with the P-type dopant may be etched in a subsequent process to form the first electrode CNE1. The P-type dopant may include any one selected from among boron (B), aluminum (Al), gallium (Ga), and indium (In) and may be doped at a concentration ranging from about $10^{15}/cm^3$ to about $10^{20}/cm^3$.

Figure 21:
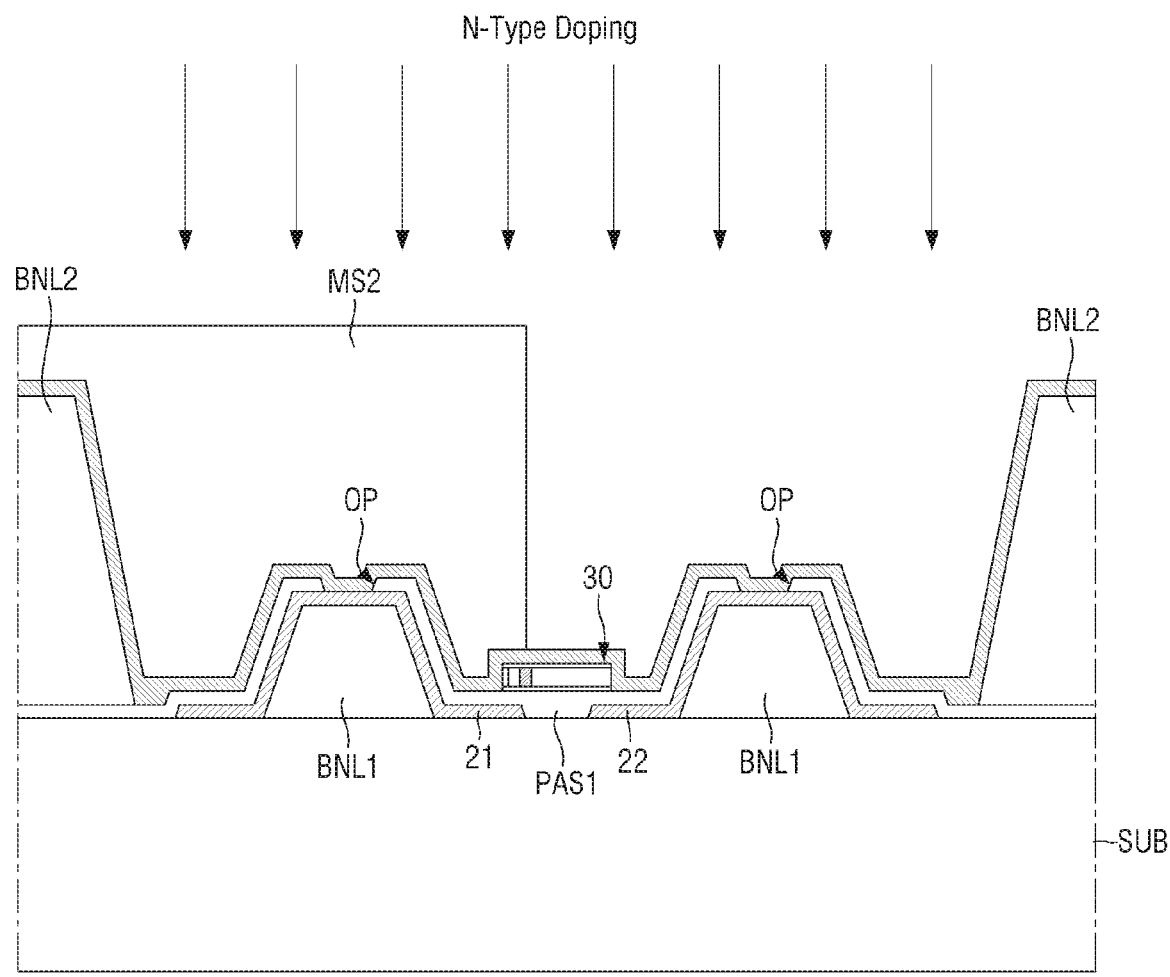

Next, referring to FIG. 21, a second mask pattern MS2 is formed on the target substrate SUB. The second mask pattern MS2 may be formed to overlap the light emitting element 30, the first alignment electrode 21, and the second bank BNL adjacent to the first alignment electrode 21. In an embodiment, the second mask pattern MS2 is formed in a direction toward the first alignment electrode 21 with respect to the center of the light emitting element 30 in one pixel. Accordingly, the amorphous silicon layer 50 in the direction toward the second alignment electrode 22 with respect to the center of the light emitting element 30 is exposed.

Then, an N-type dopant is doped into the target substrate SUB. The N-type dopant may be doped into the amorphous silicon layer 50 exposed by the second mask pattern MS2. For example, the amorphous silicon layer 50 doped with the N-type dopant may be conductorized by the N-type dopant. The amorphous silicon layer 50 doped with the N-type dopant may be etched in a subsequent process to form the second electrode CNE2. The N-type dopant may include at least one selected from among phosphorus (P), arsenic (As), and antimony (Sb) and may be doped at a concentration ranging from about $10^{15}/cm^3$ to about $10^{20}/cm^3$. After the above-described doping process of the N-type dopant is completed, the target substrate SUB is heat-treated to activate the N-type dopant and the P-type dopant.

Figure 22:
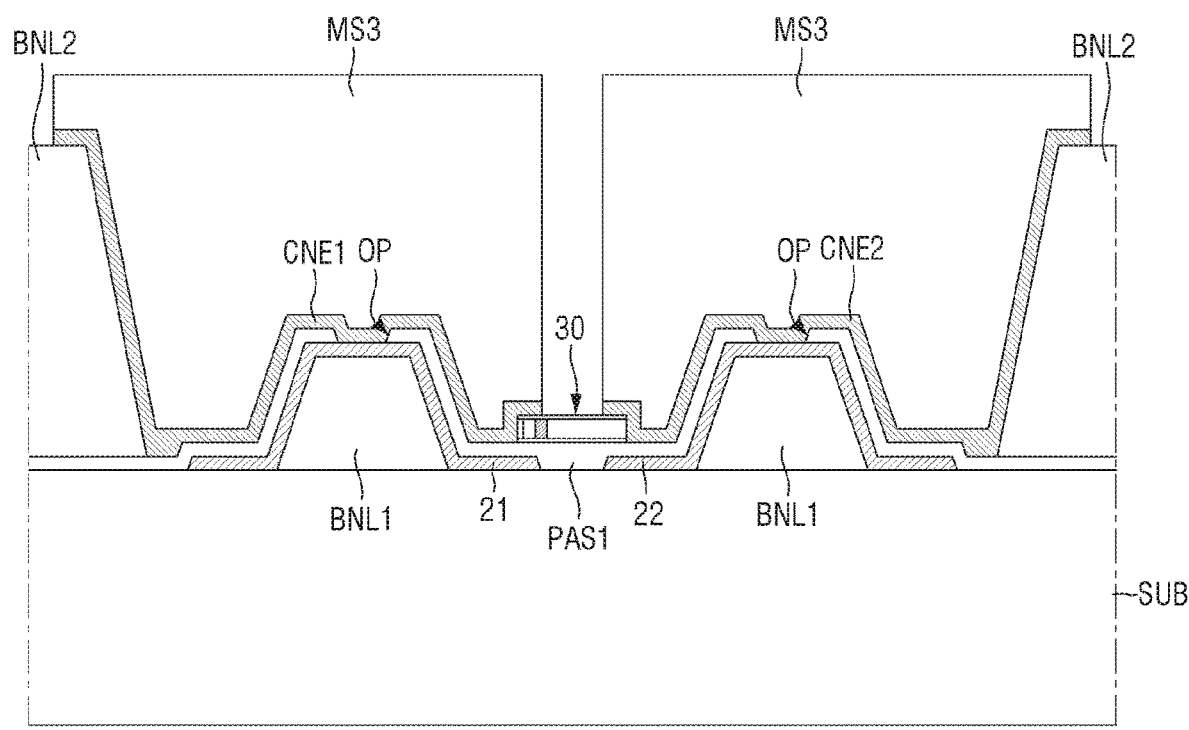

Next, referring to FIG. 22, a third mask pattern MS3 is formed on the target substrate SUB. The third mask pattern MS3 is entirely formed except for a portion overlapping the light emitting element 30 and a portion overlapping the second bank BNL2. Subsequently, a portion of the amorphous silicon layer 50 is etched using the third mask pattern MS3 to form the amorphous silicon layer 50 as the first electrode CNE1 and the second electrode CNE2. The etched region of the amorphous silicon layer 50 is arranged in (e.g., extends in) parallel with the direction in which the first bank BNL1 extends so that the first electrode CNE1 and the second electrode CNE2 may be spaced apart from each other in one pixel (e.g., in one sub-pixel). The first electrode CNE1 and the second electrode CNE2 may each be etched into an island pattern shape in one pixel. In addition, the first electrode CNE1 may contact one end of the light emitting element 30, and the second electrode CNE2 may contact the other end of the light emitting element 30.

Figure 23:
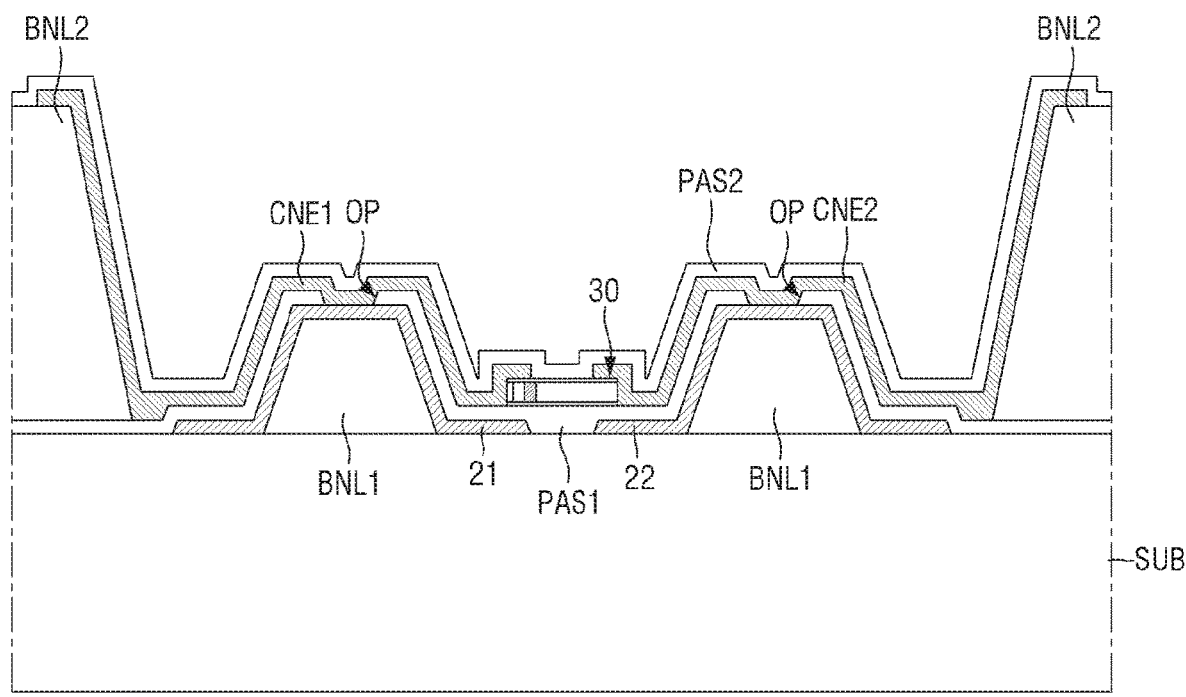

Next, referring to FIG. 23, a display device according to another embodiment is manufactured by forming a second insulating layer PAS2 on the target substrate SUB.

In the method for manufacturing a display device according to the above-described embodiments, the second electrode or the first and second electrodes are formed by doping a dopant into amorphous silicon so that a mask for forming each of first and second electrodes and a plurality of insulating layers may be omitted. Therefore, it is possible to reduce manufacturing cost, improve productivity, and facilitate the process.

In concluding the detailed description, those skilled in the art will appreciate that many variations and modifications can be made to the embodiments described herein without departing from the aspects and features of the present disclosure. Therefore, the disclosed embodiments of the the present disclosure are to be used in a generic and descriptive sense and not for purposes of limitation.

What is claimed is:

1. A display device comprising:
   a first alignment electrode and a second alignment electrode on a substrate, the first and second alignment electrodes extending in a first direction and being spaced apart from each other;
   an amorphous silicon layer on the first alignment electrode and the second alignment electrode, the amorphous silicon layer having an insulating portion covering the first alignment electrode and an electrode portion covering the second alignment electrode, the electrode portion of the amorphous silicon layer comprising an N-type dopant;
   a light emitting element on the amorphous silicon layer, one end of the light emitting element being on the insulating portion and another end of the light emitting element contacting the electrode portion of the amorphous silicon layer;
   a first insulating layer on the light emitting element and extending in the first direction; and
   a first electrode contacting the one end of the light emitting element.

2. The display device of claim 1, wherein the N-type dopant comprises at least one selected from among phosphorus (P), arsenic (As), and antimony (Sb).

3. The display device of claim 2, wherein a concentration of the N-type dopant ranges from $10^{15}/cm^3$ to $10^{20}/cm^3$.

4. The display device of claim 1, wherein the insulating portion of the amorphous silicon layer overlaps the first electrode and the light emitting element, and the electrode portion of the amorphous silicon layer does not overlap the first electrode and the light emitting element in a direction perpendicular to the substrate.

5. The display device of claim 1, wherein the electrode portion of the amorphous silicon layer covering the second alignment electrode has an electrode contact portion having a thickness larger than that of the insulating portion of the amorphous silicon layer.

6. The display device of claim 5, wherein the electrode contact portion of the amorphous silicon layer contacts a side of the another end of the light emitting element, and
   wherein a top surface of the electrode contact portion and a top surface of the light emitting element coincide with each other in a horizontal direction.

7. The display device of claim 1, further comprising a second insulating layer covering the first electrode, the first insulating layer, the light emitting element, and the electrode portion of the amorphous silicon layer.

8. The display device of claim 1, wherein the insulating portion of the amorphous silicon layer has an opening exposing the first alignment electrode, a bottom surface of the first electrode contacts a top surface of the first alignment electrode through the opening, and a bottom surface of the electrode portion contacts a top surface of the second alignment electrode.

9. A method for manufacturing a display device, the method comprising:
   preparing a target substrate comprising a first alignment electrode and a second alignment electrode, the first and second alignment electrodes extending in a first direction and being spaced apart from each other;
   forming an amorphous silicon layer on the first alignment electrode and the second alignment electrode;
   aligning a light emitting element on the amorphous silicon layer;
   forming a first insulating layer on the light emitting element and extending in the first direction;
   forming a first electrode on one end of the light emitting element and the amorphous silicon layer, the first electrode contacting the one end of the light emitting element; and
   forming an insulating portion of the amorphous silicon layer and an electrode portion of the amorphous silicon layer by doping an N-type dopant into a portion of the amorphous silicon layer,
   wherein the insulating portion of the amorphous silicon layer covers the first alignment electrode, and the electrode portion of the amorphous silicon layer covers the second alignment electrode,
   wherein one end of the light emitting element is on the insulating portion of the amorphous silicon layer, and another end of the light emitting element contacts the electrode portion of the amorphous silicon layer.

10. The method of claim 9, wherein the electrode portion of the amorphous silicon layer is doped with the N-type dopant, and
    wherein the first electrode and the light emitting element mask the insulating portion of the amorphous silicon layer such that the insulating portion is not doped with the N-type dopant.

11. The method of claim 9, wherein the N-type dopant comprises at least one selected from among phosphorus (P), arsenic (As), and antimony (Sb).

12. The method of claim 9, wherein the electrode portion is doped with the N-type dopant at a concentration ranging from $10^{15}/cm^3$ to $10^{20}/cm^3$.

13. The method of claim 9, wherein the amorphous silicon layer is formed using a halftone mask such that the amorphous silicon layer has an electrode contact portion, the electrode contact portion being a portion of the electrode portion having a thickness larger than that of the insulating portion.

* * * * *